United States Patent
Strassburg et al.

(10) Patent No.: US 9,178,016 B2
(45) Date of Patent: Nov. 3, 2015

(54) CHARGE PROTECTION FOR III-NITRIDE DEVICES

(71) Applicant: Infineon Technologies Austria AG, Villach (AT)

(72) Inventors: Matthias Strassburg, Klagenfurt (AT); Roman Knoefler, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/782,305

(22) Filed: Mar. 1, 2013

(65) Prior Publication Data

US 2014/0246760 A1    Sep. 4, 2014

(51) Int. Cl.
*H01L 29/06* (2006.01)
*H01L 21/02* (2006.01)
*H01L 29/40* (2006.01)
*H01L 29/66* (2006.01)
*H01L 29/778* (2006.01)
*H01L 29/15* (2006.01)
H01L 29/20 (2006.01)

(52) U.S. Cl.
CPC .......... *H01L 29/0638* (2013.01); *H01L 21/022* (2013.01); *H01L 21/0214* (2013.01); *H01L 29/155* (2013.01); *H01L 29/402* (2013.01); *H01L 29/66431* (2013.01); *H01L 29/66462* (2013.01); *H01L 29/778* (2013.01); *H01L 29/7786* (2013.01); H01L 29/2003 (2013.01)

(58) Field of Classification Search
CPC .................. H01L 29/66462; H01L 29/66431; H01L 29/402; H01L 29/404; H01L 29/405; H01L 29/407; H01L 29/0638; H01L 21/0214; H01L 21/02178; H01L 21/02181; H01L 21/02189; H01L 21/02192
USPC .......... 257/194, 195, E21.407, 637, E29.009, 257/367; 438/167, 168, 169, 170, 171, 172, 438/173, 174, 175, 176, 177, 178, 179, 180, 438/181, 182, 183, 184, 185, 476
See application file for complete search history.

(56) References Cited

U.S. PATENT DOCUMENTS

| | | | | |
|---|---|---|---|---|
| 8,940,593 | B2 * | 1/2015 | Ramdani | 438/172 |
| 2007/0235775 | A1 * | 10/2007 | Wu et al. | 257/288 |
| 2009/0072272 | A1 * | 3/2009 | Suh et al. | 257/194 |
| 2010/0224911 | A1 * | 9/2010 | Okita et al. | 257/194 |
| 2010/0327322 | A1 * | 12/2010 | Kub et al. | 257/194 |
| 2012/0217544 | A1 * | 8/2012 | Ohki | 257/194 |
| 2014/0001479 | A1 * | 1/2014 | Kudymov | 257/76 |

(Continued)

*Primary Examiner* — Anthony Ho
*Assistant Examiner* — Samuel Lair
(74) *Attorney, Agent, or Firm* — Murphy, Bilak & Homiller, PLLC

(57) ABSTRACT

A semiconductor device includes a III-nitride semiconductor substrate having a two-dimensional charge carrier gas at a depth from a main surface of the III-nitride semiconductor substrate. A surface protection layer is provided on the main surface of the III-nitride semiconductor substrate. The surface protection layer has charge traps in a band gap which exist at room temperature operation of the semiconductor device. A contact is provided in electrical connection with the two-dimensional charge carrier gas in the III-nitride semiconductor substrate. A charge protection layer is provided on the surface protection layer. The charge protection layer includes an oxide and shields the surface protection layer under the charge protection layer from radiation with higher energy than the bandgap energy of silicon nitride.

29 Claims, 22 Drawing Sheets

(56) References Cited

U.S. PATENT DOCUMENTS

2014/0001640 A1* 1/2014 Nishizawa ............... 257/773
2014/0209922 A1* 7/2014 Ota et al. ............... 257/76
2014/0312362 A1* 10/2014 Makiyama ............... 257/77

* cited by examiner

US 9,178,016 B2

CHARGE PROTECTION FOR III-NITRIDE DEVICES

TECHNICAL FIELD

The instant application relates to III-nitride devices, more particularly to III-nitride devices with charge protection.

BACKGROUND

GaN devices typically include a barrier region, such as AlGaN or InAlGaN, formed on a GaN buffer to automatically form a two-dimensional (2D) charge carrier gas channel near the barrier-buffer interface. The channel is formed by a 2D electron gas for n-channel devices and by a 2D hole gas for p-channel devices. In the fabrication of such GaN devices, a shift in the threshold voltage of the transistors can occur for various reasons. A threshold voltage shift results in an increase in the variation of the threshold voltage across the wafer, reducing yield.

One cause of threshold voltage shift in GaN devices is the so-called charging of the silicon nitride (SiN) layer typically formed on the surface of the barrier region in order to prevent oxidation of the barrier surface. Charging involves the storage and generation of charge traps in the silicon nitride layer. These charge traps shift the device threshold voltage when the silicon nitride layer is interposed between the active semiconductor region and certain metallizations, such as the gate structure. Electron and hole traps can arise in silicon nitride at point defects such as paramagnetic defects (e.g. ≡Si., ≡Si—O—O., ≡Si2N.), diamagnetic defects (e.g. ≡Si—Si≡, ≡N—H), two coordinated Si-atoms with lone pair electrons (e.g. ≡Si:), neutral defects (e.g. ≡SiO., ≡SiOH), charged defects (e.g. ≡Si., +Si≡), intrinsic defects (e.g. ≡Si., ≡N—N≡, ≡Si—O—O—Si≡) and extrinsic defects (e.g. ≡SiH, ≡Si2NH, ≡SiOH). Electron and hole traps can also arise in silicon nitride in the presence of existing residual Si—H bonds (so-called silicon-hydrogen-complexes), due to the polarity of the Si—H binding. The formation of silicon nitride produces residual hydrogen in the silicon nitride, forming the Si—H bonds, which have a localized hydrogen valence electron in a covalent bond between a hydrogen and silicon atom. Si—H bonds have a relatively deep energy trap level and, therefore, the resulting charge traps are stable at room temperature.

In each case, the storage and generation of holes and electrons in a silicon nitride layer formed on the surface of a barrier region of a GaN device result in charging of the silicon nitride layer. Various standard GaN processing steps cause such charging. This charging is caused in part by ultraviolet (UV) light which is present in standard GaN processing. UV light impinging on a GaN device during operation also causes charging of the silicon nitride anti-oxidation layer, meaning that the threshold voltage variation can change over time. In general radiation with higher energy than the bandgap energy of silicon nitride can degrade GaN device performance and reliability.

SUMMARY

According to an embodiment of a semiconductor device, the semiconductor device comprises a III-nitride semiconductor substrate having a two-dimensional charge carrier gas at a depth from a main surface of the III-nitride semiconductor substrate. A surface protection layer is provided on the main surface of the III-nitride semiconductor substrate. The surface protection layer has charge traps in a band gap which exist at room temperature operation of the semiconductor device. A contact is provided in electrical connection with the two-dimensional charge carrier gas in the III-nitride semiconductor substrate. A charge protection layer is provided on the surface protection layer. The charge protection layer includes an oxide and shields the surface protection layer under the charge protection layer from radiation with higher energy than the bandgap energy of silicon nitride.

According to an embodiment of a method of manufacturing a semiconductor device, the method comprises: forming a III-nitride semiconductor substrate having a two-dimensional charge carrier gas at a depth from a main surface of the III-nitride semiconductor substrate; forming a surface protection layer on the main surface of the III-nitride semiconductor substrate, the surface protection layer having charge traps in a band gap which exist at room temperature operation of the semiconductor device; forming a contact in electrical connection with the two-dimensional charge carrier gas in the III-nitride semiconductor substrate; and forming an charge protection layer on the surface protection layer, the charge protection layer comprising an oxide and shielding the surface protection layer under the charge protection layer from radiation with higher energy than the bandgap energy of silicon nitride.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

The embodiments described next prevent, or at least significantly reduce, charging of a surface protection layer formed on the surface of an III-nitride substrate by providing a charge protection layer on the surface protection layer. The charge protection layer comprises an oxide such as a metal oxide and/or silicon oxynitride, and shields the surface protection layer under the charge protection layer from radiation with higher energy than the bandgap energy of silicon nitride (e.g. ultraviolet light). This in turn prevents additional charge carriers from being stored in the surface protection layer, and also prevents defects such as point defects from being produced in the surface protection layer. Due to the charge protection layer, negative impact of charging, e.g. shift of threshold voltage, is avoided or significantly reduced. The charge protection layer can be provided before or after final passivation of the semiconductor device.

Figure 1:
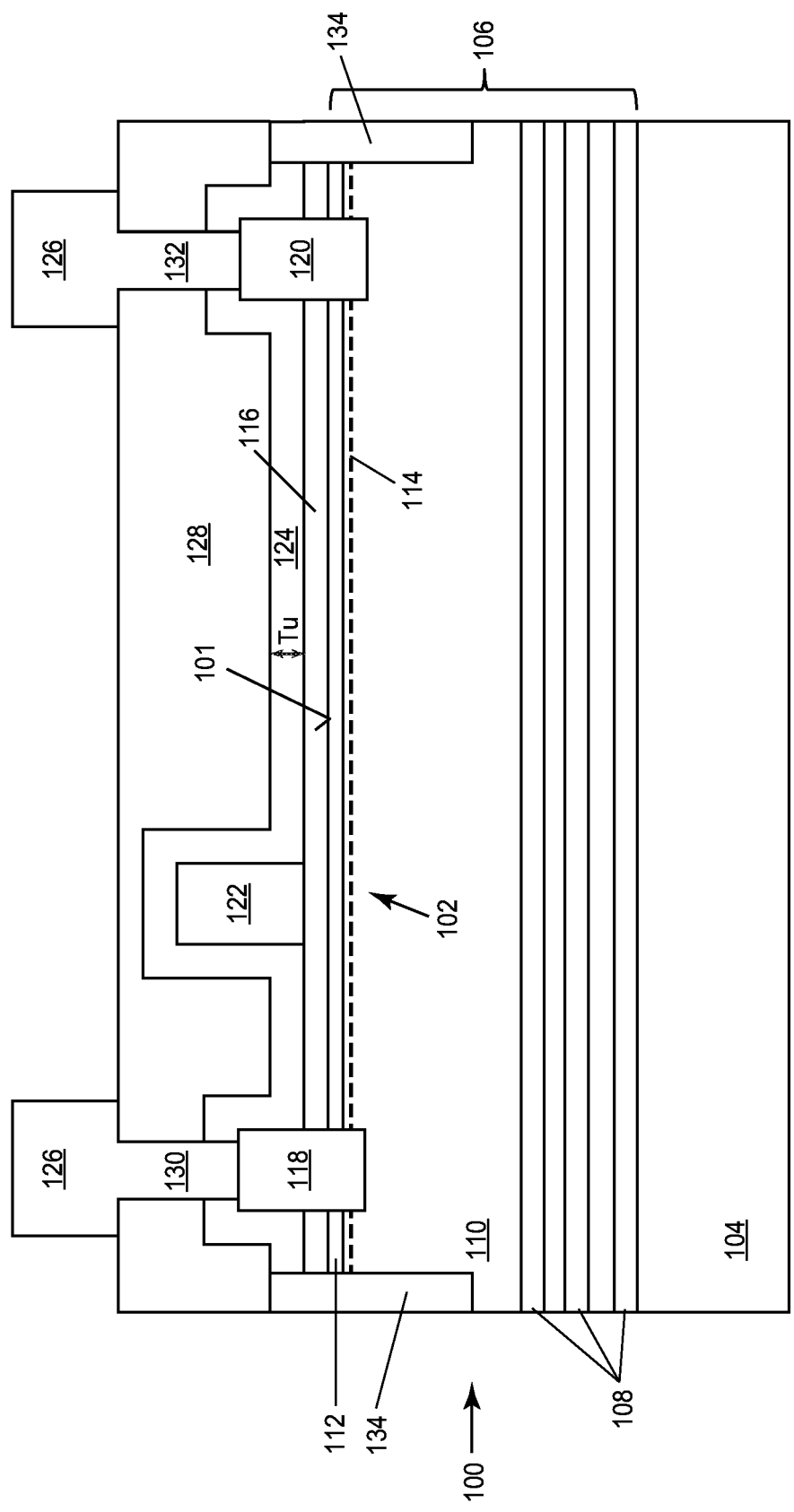
FIG. 1 illustrates a cross-sectional view of an embodiment of a semiconductor die having a III-nitride semiconductor substrate and an charge protection layer.

FIG. 1 illustrates a partial cross-sectional view of a semiconductor device according to an embodiment. The semiconductor device includes a III-nitride semiconductor substrate 100. The III-nitride substrate 100 incorporates a junction between two materials with different band gaps (i.e. a heterojunction) as the channel 102. For example, GaN may be combined with AlGaN or AlInGaN to form the channel 102. The III-nitride substrate 100 may have AlInN/AlN/GaN barrier/spacer/buffer layer structures. The III-nitride semiconductor substrate 100 can include a semiconductor wafer 104 and one or more epitaxial layers 106 grown on the wafer 104. The growth wafer 104 can be thinned or entirely removed later in processing, if desired. In the case of a GaN substrate 100, one or more nucleation and/or transition layers 108 can be grown on the wafer 104 followed by a GaN buffer region 110 which can include, e.g. AlN/AlGaN/GaN. A GaN alloy barrier region 112 is then grown on the GaN buffer region 110.

In general with GaN technology, the presence of polarization charges and strain effects result in the realization of a two-dimensional charge carrier gas 114 which is a two-dimensional electron or hole inversion layer characterized by very high carrier density and carrier mobility. Such a two-dimensional charge carrier gas 114, such as a 2DEG (two-dimensional electron gas) or 2DHG (two-dimensional hole gas), forms a conductive channel region 102 of the semiconductor device near the interface between the GaN alloy (e.g. AlN or AlGaN) barrier region 112 and the GaN buffer region 110 at a depth from a main surface 101 of the III-nitride semiconductor substrate 100. The thickness of the GaN alloy barrier region 112 preferably is larger than 2 nm, larger than 5 nm, or even larger than 10 nm, but does not exceed 100 nm. The Al content in the GaN alloy barrier region 112 preferably is at least sufficiently high to prevent from thermal emission across the band offset to GaN. A thin, e.g. 1-2 nm, AlN layer can be provided between the GaN buffer region 110 and the GaN alloy barrier region 112 to minimize alloy scattering and enhance 2DEG mobility. In general, any III-nitride based heterostructure can be used where a band discontinuity is responsible for the device concept and one or more two-dimensional charge carrier gases 114 can be provided.

The compound semiconductor device further includes a surface protection layer 116 on the main surface 101 of the III-nitride semiconductor substrate 100. The surface protection layer 116 has charge traps in a band gap which exist at room temperature operation of the semiconductor device. In some embodiments, the surface protection layer 116 also prevents oxidation of the main surface 101 of the III-nitride semiconductor substrate 100 e.g. in the case of silicon nitride on a GaN-based material. In the case of a silicon nitride surface protection layer 116, charge traps can arise in the surface protection layer 116 due to Si—H bonds in the silicon nitride material which can be broken by UV charging. In another embodiment, the surface protection layer 116 comprises a thin (e.g. several atomic layers thick such as between 1 and 20 atomic layers, or between 3 and 10 atomic layers) layer of GaN on the GaN alloy barrier region 114 instead of or in addition to silicon nitride. Depending on the composition of the III-nitride substrate 100, still other materials can be used as the surface protection layer 116.

One or more separate contacts 118, 120 are in electrical connection with the two-dimensional charge carrier gas 114 in the III-nitride semiconductor substrate 100. In the embodiment illustrated in FIG. 1, the semiconductor device is a lateral transistor with a source contact 118 and drain contact 120 both extending through the surface protection layer 116 to the two-dimensional charge carrier gas 114 at the same side 101 of the device. The source and drain contacts 118, 120 are spaced apart by the channel 102. In another embodiment, the device can be a vertical or quasi-vertical device in that the source and drain are contacted at opposing sides of the substrate 100. In each case, the contacts 118, 120 can comprise any suitable material(s) such as doped silicon or other doped semiconductor material, metal(s)/metal alloy(s), etc. The contacts 118, 120 can extend through the two-dimensional charge carrier gas 114 as shown in FIG. 1. Alternatively, the contacts 118, 120 can terminate just prior to reaching the two-dimensional charge carrier gas 114. In this case, carrier tunneling completes the electrical connection between the contacts 118, 120 and the two-dimensional charge carrier gas 114.

A gate 122 is provided for controlling the underlying channel 102 formed by the two-dimensional charge carrier gas 114. The gate 122 can be disposed on the surface protection layer 116 as shown in FIG. 1, extend through the surface protection layer 116 in contact with the III-nitride substrate 100, or extend into the III-nitride substrate 100.

A charge protection layer 124 is also provided on the surface protection layer 116. The charge protection layer 124 comprises an oxide, i.e. a chemical compound that contains at least one oxygen atom and another element, and shields the surface protection layer 116 under the charge protection layer 124 from radiation with higher energy than the bandgap energy of silicon nitride (e.g. ultraviolet light). In one embodiment, the charge protection layer 124 comprises silicon oxynitride. In another embodiment the charge protection layer 124 comprises at least one metal oxide such as rare earth oxides or oxynitrides, $Al_2O_3$, $HfO_x$, $ZrO_x$ and/or HfON, ZrON. The charge protection layer 124 can comprise both a metal oxide and silicon oxynitride. Depending on the composition of the III-nitride substrate 100 and the surface protection layer 116, still other materials can be used as a charge protection layer 124 for shielding the surface protection layer 116 under the charge protection layer 124 from radiation with higher energy than the bandgap energy of silicon nitride (e.g. ultraviolet light).

The thickness (Tu) of the charge protection layer 124 depends on the application and subsequent processing, and for silicon oxynitride can range from 1-5 nm, 5-20 nm, 20-50 nm, or 50-200 nm, for example. The thickness and oxygen content of the charge protection layer 124 determine the amount of radiation blocking provided. In some embodiments, the charge protection layer 124 can have a step-wise or continuous graded (i.e., varying) composition of oxygen which results in a corresponding graded band gap energy. The oxygen content can change monotonically or non-monotonically over the thickness of the charge protection layer 124. A graded oxygen content can be realized by varying the oxygen content over the thickness of the charge protection layer 124, or by constructing the charge protection layer 124 from multiple sub-layers, each having a different oxygen content. For example in the case of a silicon oxynitride layer 124, the oxygen/nitrogen ratio of the layer 124 can be varied. In general, the band gap energy of the charge protection layer 124 can be varied by grading the oxygen content, enabling the charge protection layer 124 to absorb radiation of different wavelengths.

Figure 2:
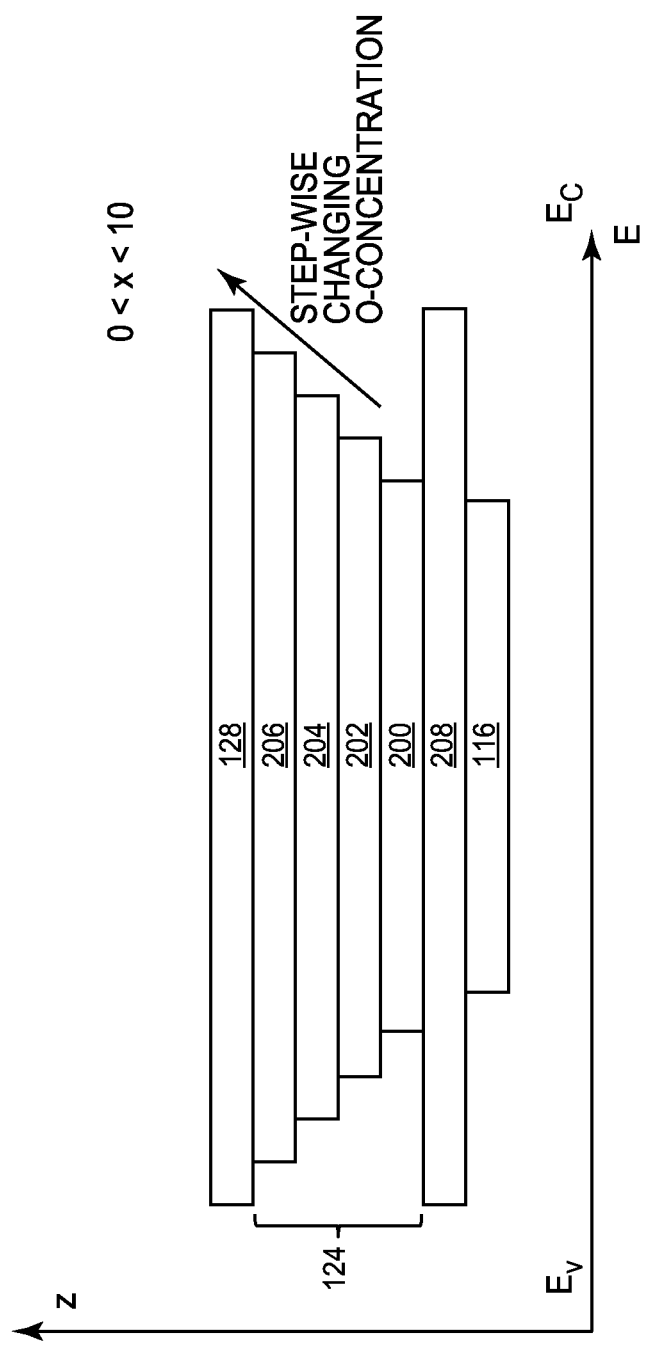
FIG. 2 illustrates a band gap diagram of the charge protection layer included in the device of FIG. 1, with a step-wise graded oxygen concentration.

FIG. 2 illustrates a band diagram for an embodiment of the charge protection layer 124 having a graded oxygen content realized by constructing the charge protection layer 124 from multiple sub-layers 200, 202, 204, 206, each having a different oxygen content, where '$E_C$' and '$E_V$' correspond to the conduction band and valence band, respectively. According to this embodiment, the surface protection layer 116 on which the charge protection layer 124 is disposed comprises silicon nitride. A layer 208 of silicon dioxide ($SiO_2$) or SiON with large concentration of O (e.g. O/N-ratio>1) is formed on the silicon nitride layer 116. Several sub-layers 200, 202, 204, 206 of silicon oxynitride (SiON) are formed on the layer 208 of silicon dioxide/SiON with large concentration of oxygen (e.g. O/N-ratio>1), each silicon oxynitride sub-layer having a different oxygen content so that the silicon oxynitride sub-layers disposed closest to the silicon nitride surface protection layer 116 have a lower oxygen content than the silicon oxynitride sub-layers disposed further from the silicon nitride surface protection layer 116. The interlayer dielectric 128 on the charge protection layer 124 comprises silicon dioxide or silicon oxynitride.

The silicon oxynitride sub-layers with lower oxygen content have lower band gap energy than the silicon oxynitride sub-layers with higher oxygen content. The charge protection layer 124 has a step-wise graded oxygen content and, therefore, a step-wise graded band gap energy over its thickness (z), according to this embodiment. The composition of the oxygen decreases in the charge protection layer 124 heading toward the III-nitride semiconductor substrate in a direction (−z) perpendicular to the main surface 101 of the III-nitride semiconductor substrate 100.

Figure 3:
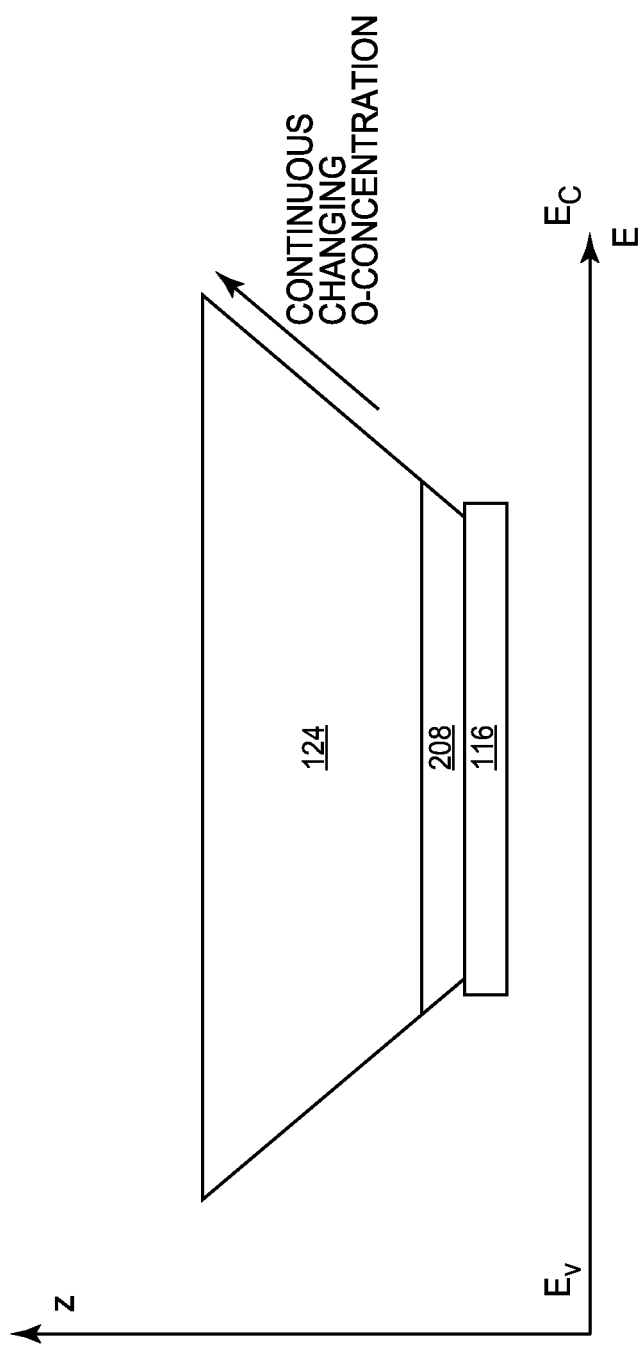
FIG. 3 illustrates a band gap diagram of the charge protection layer included in the device of FIG. 1, with a continuous graded oxygen concentration.

FIG. 3 illustrates a band diagram for another embodiment of the charge protection layer 124 having a graded oxygen content. The embodiment shown in FIG. 3 is similar to the one shown in FIG. 2, however, the charge protection layer 124 has a continuous graded oxygen content and, therefore, a continuous graded band gap energy over its thickness (z) in FIG. 3. Such a structure can be realized by adjusting the oxygen content during deposition of the charge protection layer 124.

The band diagram embodiments illustrated in FIGS. 2 and 3 can exclude the layer 208 of silicon dioxide/SiON with large concentration of oxygen (e.g. O/N-ratio>1) between the silicon nitride surface protection layer 116 and the charge protection layer 124. In either case, charging-induced charge carriers will not enter into the surface protection layer 116 or the barrier region 114 of the III-nitride substrate 100 under the charge protection layer 124. Monotonically changing oxygen concentration in the charge protection layer 124 is preferred, but alternating or varying oxygen concentrations are also feasible.

Returning to FIG. 1, electrical connections to the source and drain contacts 118, 120 are formed by a metallization layer 126 deposited on an interlayer dielectric 128 and conductive vias 130, 132 which extend from the metallization layer 126 through the interlayer dielectric 128 and the charge protection layer 124 to the respective contacts 118, 120. Similar electrical connections to the gate 122 are out of view in FIG. 1. Alternatively, the source or drain contact 118, 120 can extend to metallization deposited on the backside of the growth wafer 104 to form the corresponding electrical connection. In such an arrangement, the device can still be a lateral device or a quasi-vertical device in that current flows both laterally in the channel region 102 and vertically along the source/drain contact 118/120 which extends to the metallized backside of the wafer 104. Such vertical source/drain contacts are known by those skilled in the art, and therefore no illustration or further explanation is given herein.

FIGS. 4A through 4E illustrate partial cross-sectional views of the semiconductor device of FIG. 1 during different stages of an embodiment of a manufacturing method. Various conventional processes well known to those skilled in the art, such as material deposition and removal, dopant implantation, annealing, etc., can be employed to form various parts of the semiconductor device. No further explanation is provided with regard to such processes.

Figure 4A:
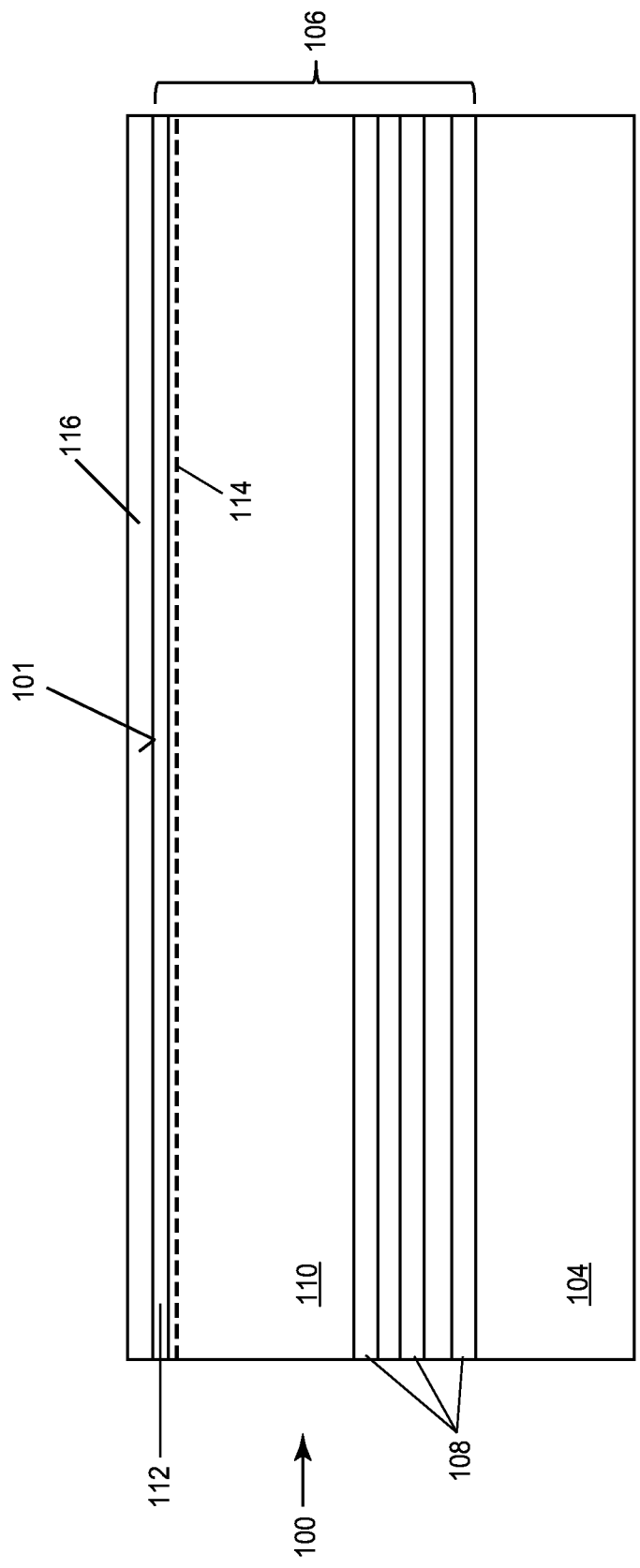
FIGS. 4A through 4E illustrate cross-sectional views of the semiconductor device shown in FIG. 1 at different stages of a manufacturing process according to an embodiment.

FIG. 4A shows the semiconductor device after the III-nitride semiconductor substrate 100 is formed on the growth wafer 104 and the surface protection layer 116 is formed on a main surface 101 of the III-nitride semiconductor substrate 100. The III-nitride semiconductor substrate 100 can comprise multiple epitaxial layers 106, as previously described and shown in FIG. 1, and has a two-dimensional charge carrier gas 114 at a depth from the main surface 101 of the III-nitride semiconductor substrate 100, also as previously explained. The surface protection layer 116 can be deposited on the III-nitride semiconductor substrate 100, e.g. in the case of silicon nitride, or grown on the III-nitride semiconductor substrate 100, e.g. in the case of a thin GaN layer. In each case, the surface protection layer 116 prevents subsequent oxidation of the main surface 101 of the III-nitride semiconductor substrate 100.

Figure 4B:
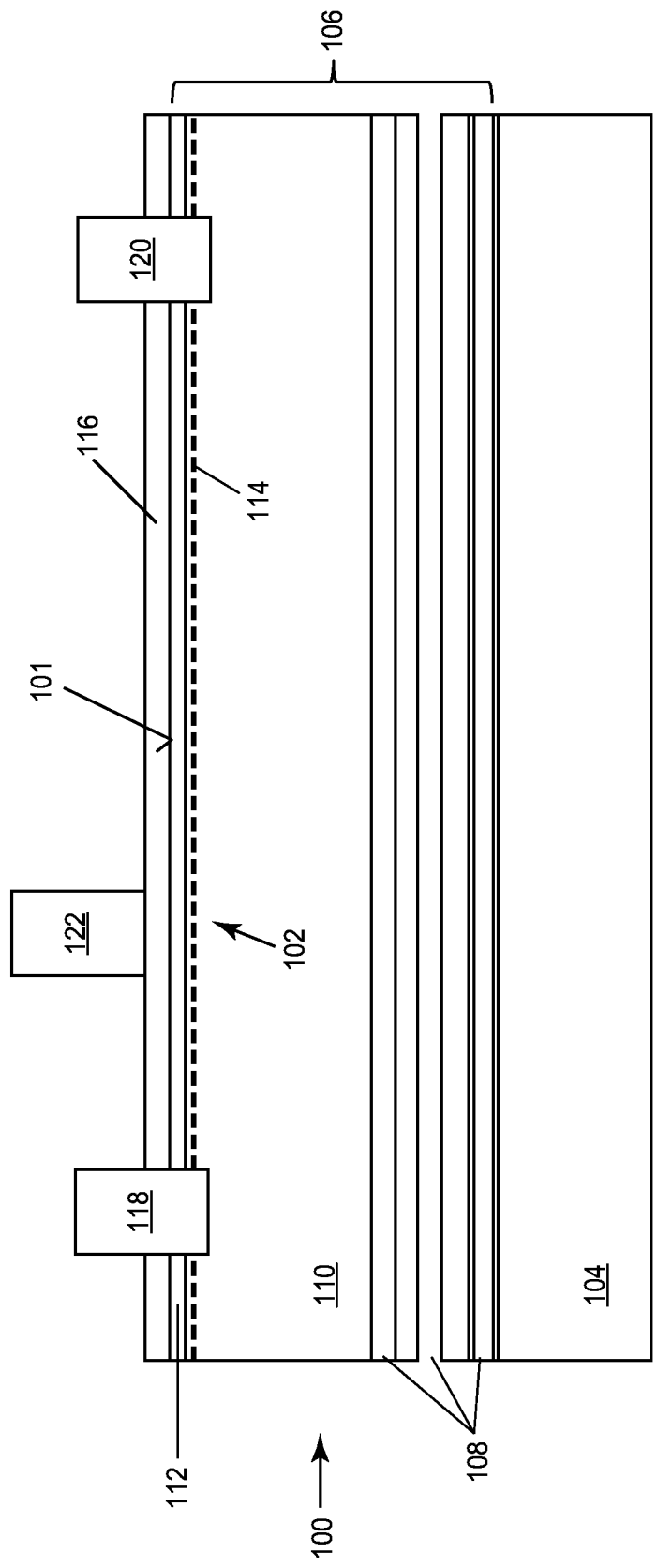

FIG. 4B shows the semiconductor device after openings are formed through the surface protection layer 116 and the source and drain contacts 118, 120 are formed in the openings and in contact with the two-dimensional charge carrier gas 114 to form the channel region 102 of the device. The contacts 118, 120 can be epitaxially grown on the exposed parts of the III-nitride semiconductor substrate 100 in the case of semiconductor contacts, deposited in the case of metal contacts or both in the case of combined metal/semiconductor contacts. The gate 122 is formed on the surface protection layer 116. In an embodiment, the gate 122 also intersects the surface protection layer 116 and/or the barrier region 112.

Figure 4C:
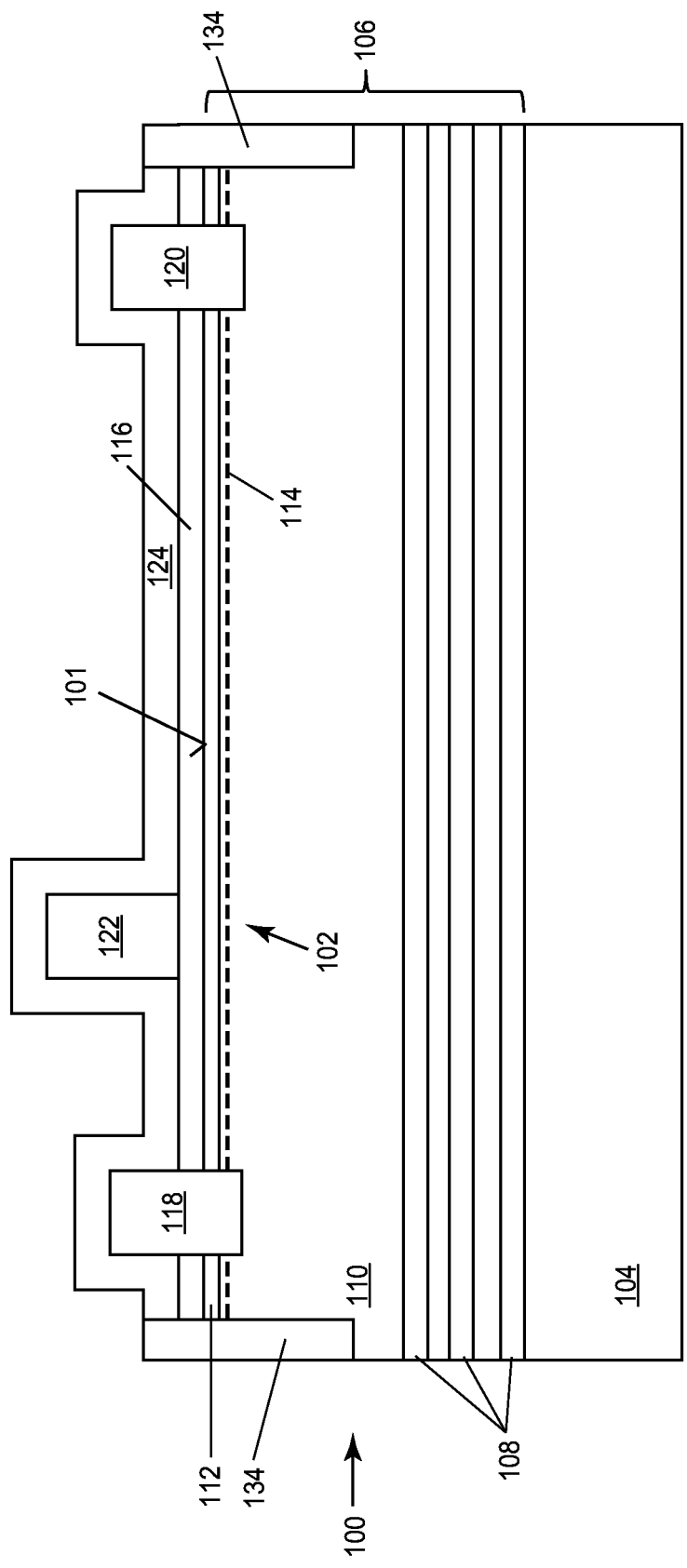

FIG. 4C shows the semiconductor device after the charge protection layer 124 is formed on the surface protection layer 116, e.g. by deposition, and after device isolation regions 134 are formed in the III-nitride semiconductor substrate 100 to isolate adjacent devices. The charge protection layer 124 covers the gate 122 on all sides except the side facing the surface protection layer 116, according to this embodiment. The charge protection layer 124 can comprise one or more sub-layers and/or have a graded oxygen content as previously described herein.

Figure 4D:
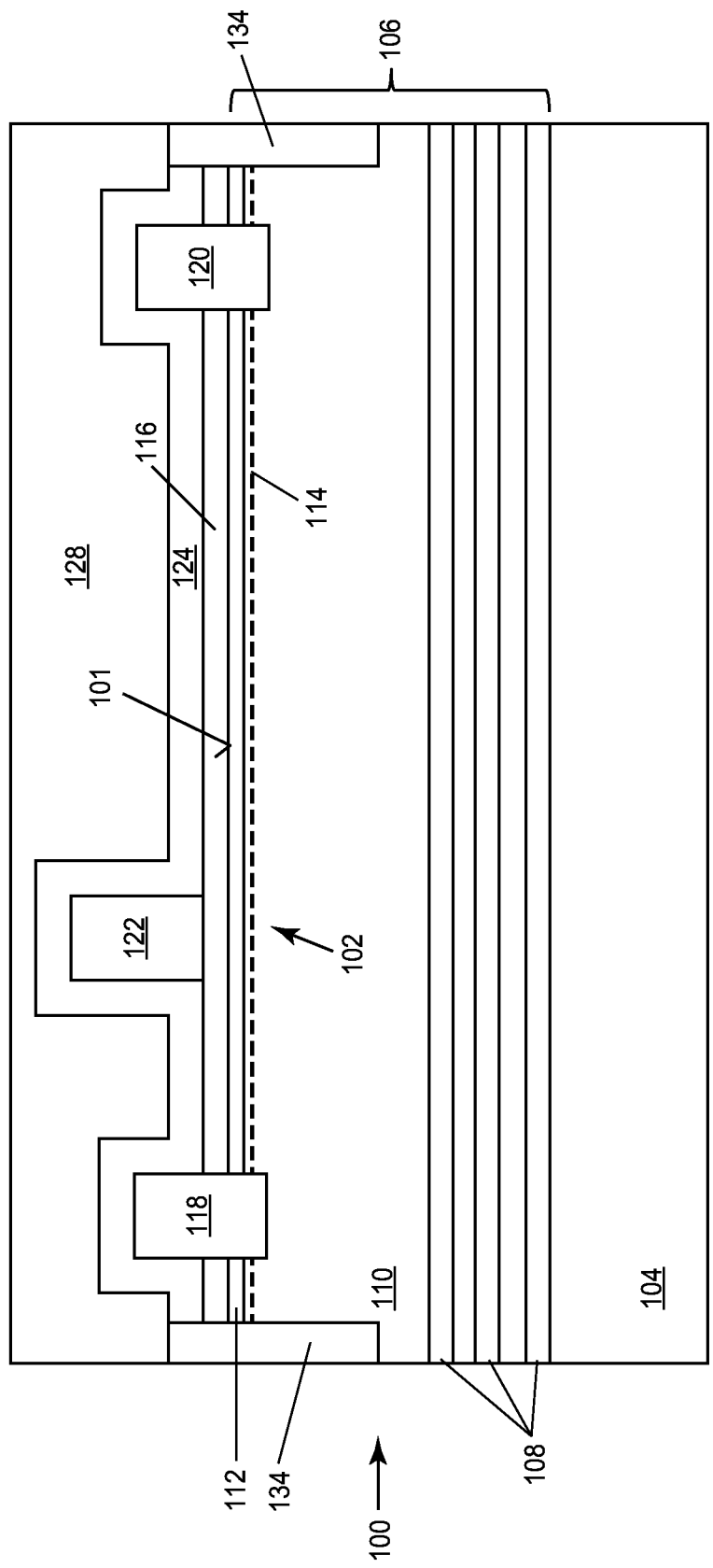

FIG. 4D shows the semiconductor device after the interlayer dielectric 128 is deposited on the charge protection layer 124. Any suitable interlayer dielectric 128 can be used, such as silicon dioxide or a lower-k dielectric material.

Figure 4E:
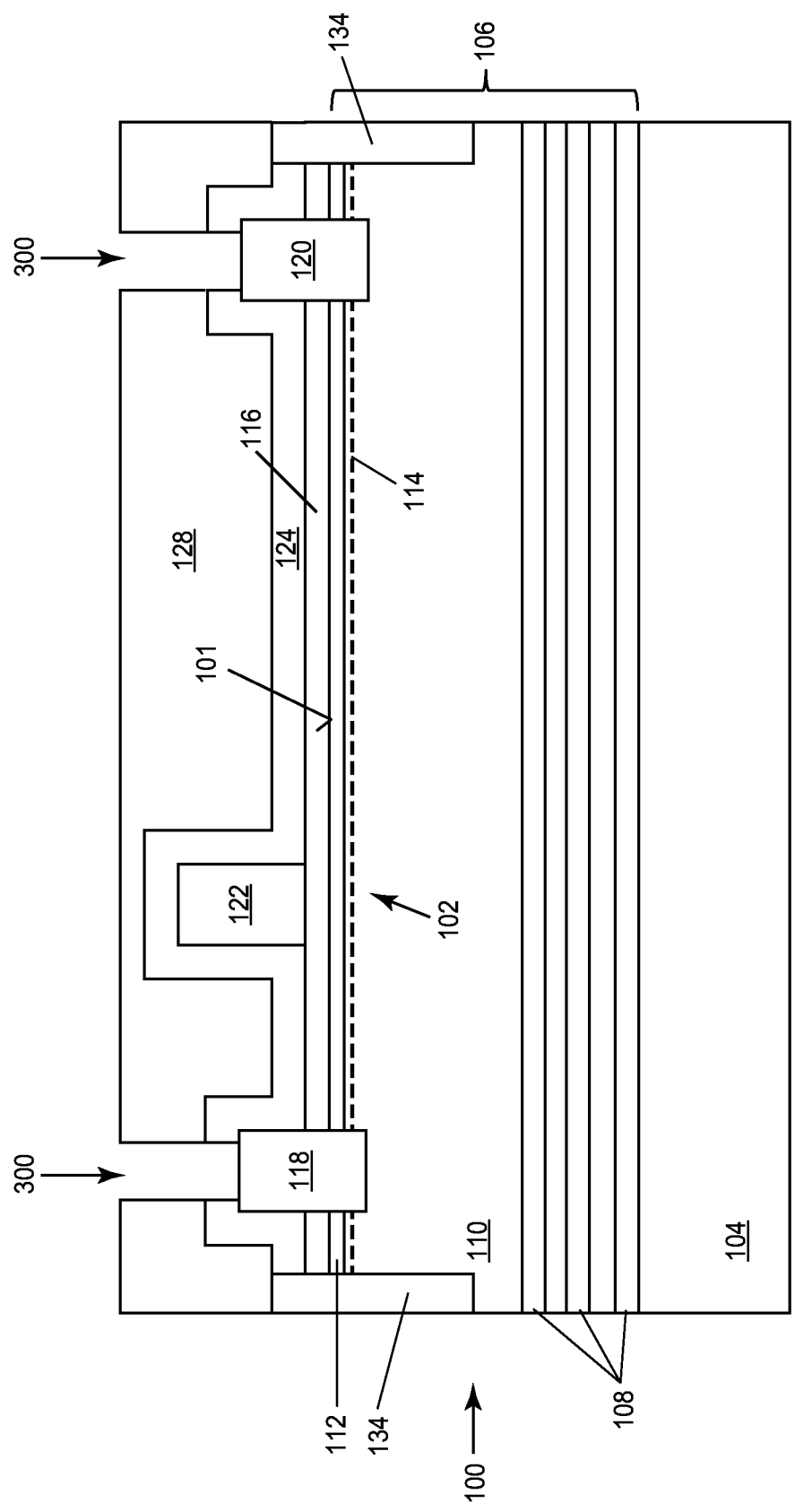

FIG. 4E shows the semiconductor device after openings 300 to the source and drain contacts 118, 120 and to the gate 122 are formed through the interlayer dielectric 128 and the charge protection layer 124. The gate openings are out-of-view in FIG. 4E. Metallization 126 can then be formed on the interlayer dielectric 128, and conductive vias 130, 132 can then be formed in the source/drain/gate openings 300, e.g. as shown in FIG. 1, to provide the necessary electrical connections for the semiconductor device. The drain or source might also have contact vias reaching the growth wafer 104. Any standard metals can be used such as Ti, Al, W, Cu, Au, Ni, Ag and/or any standard alloys as contacts comprising stacks formed of layers of metals or alloys.

Figure 5:
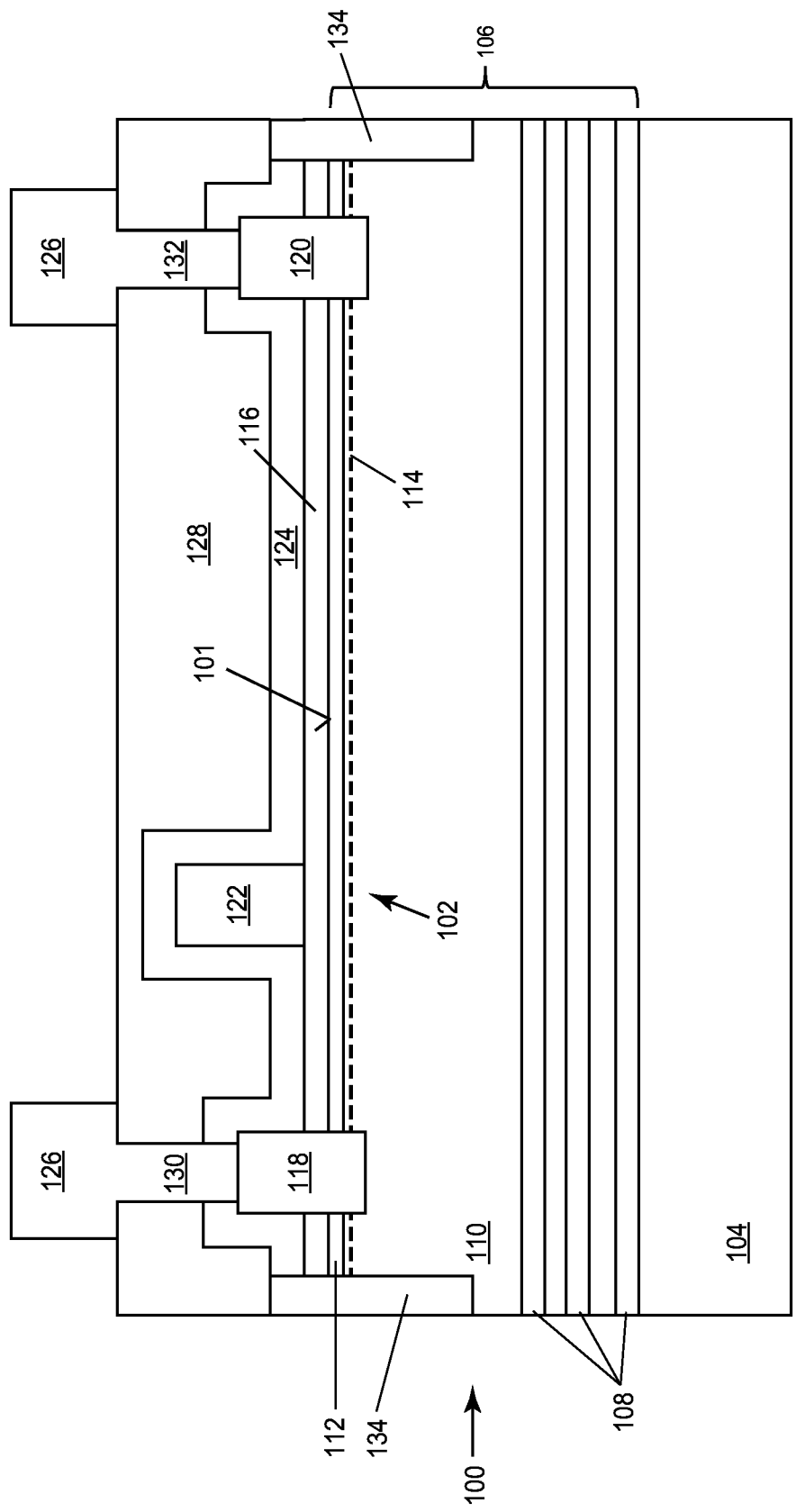
FIG. 5 illustrates a cross-sectional view of another embodiment of a semiconductor die having a III-nitride semiconductor substrate and an charge protection layer.

FIG. 5 illustrates a partial cross-sectional view of a semiconductor device according to another embodiment. The embodiment shown in FIG. 5 is similar to the embodiment shown in FIG. 1, however, the source and drain contacts 118, 120 and the gate 122 are formed after the charge protection layer 124. The charge protection layer 124 therefore provides additional protection against UV charging of the underlying surface protection layer 116 during the source/drain/gate formation process. According to this embodiment, the source and drain contacts 118, 120 extend through the charge protection layer 124 and the surface protection layer 116 to the two-dimensional charge carrier gas 114 in the III-nitride semiconductor substrate 100. The gate 122 also extends through the charge protection layer 124, ending on the surface protection layer 116.

Figure 6:
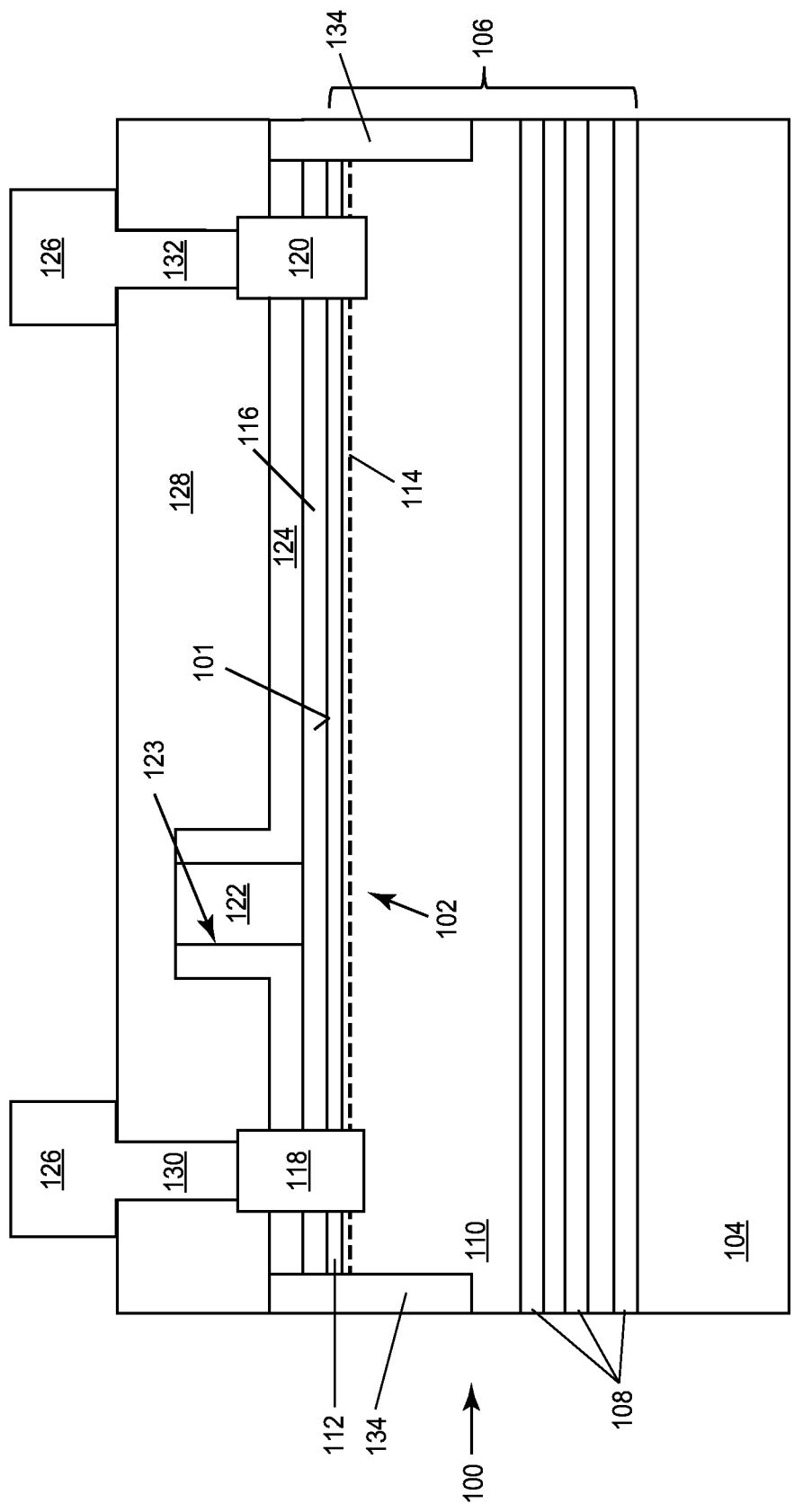
FIG. 6 illustrates a cross-sectional view of another embodiment of a semiconductor die having a III-nitride semiconductor substrate and an charge protection layer.

FIG. 6 illustrates a partial cross-sectional view of a semiconductor device according to yet another embodiment. The embodiment shown in FIG. 6 is similar to the embodiment shown in FIG. 5, however, the charge protection layer 124 covers the sidewalls 123 of the gate 124.

Figure 7:
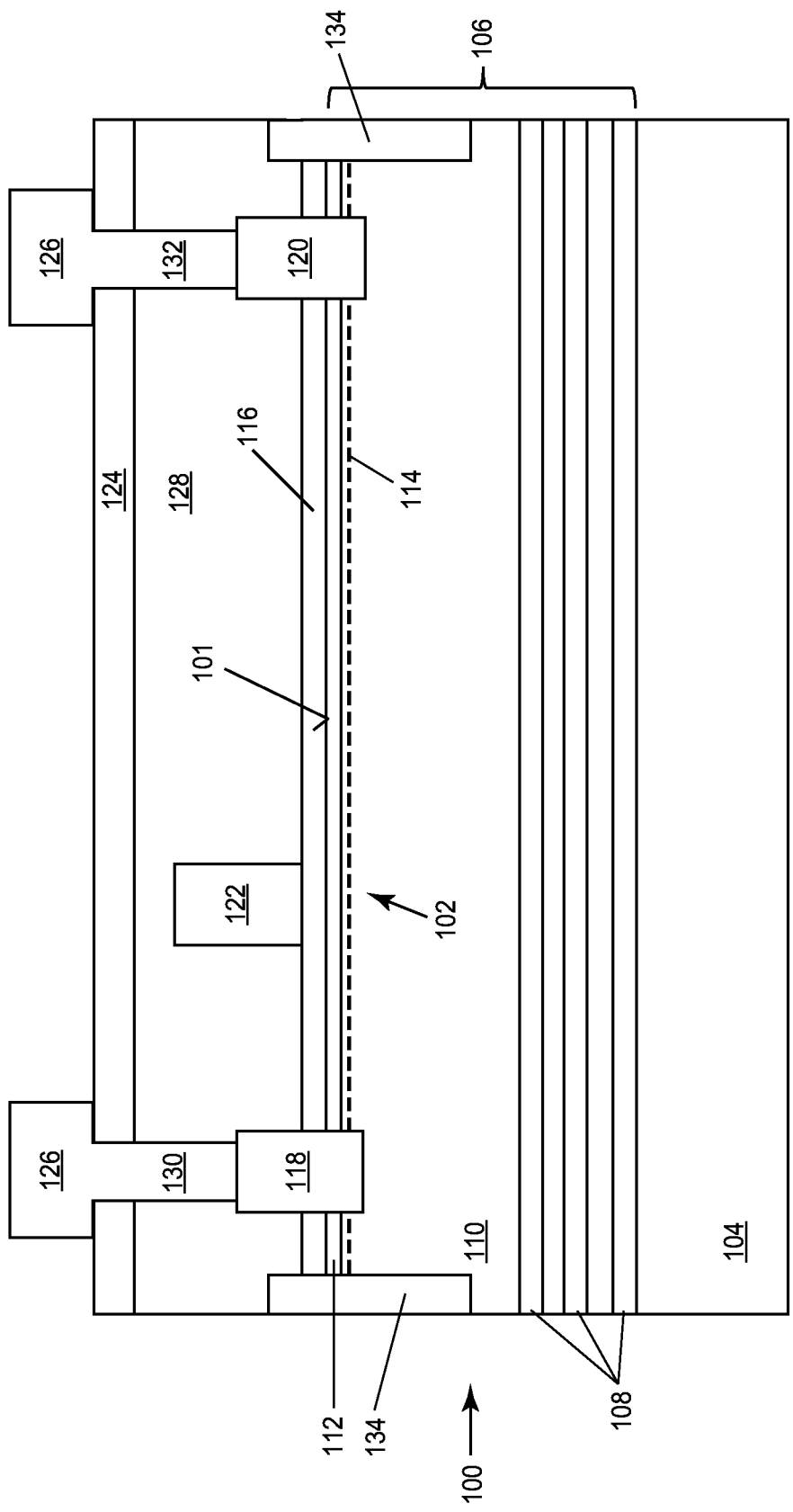
FIG. 7 illustrates a cross-sectional view of another embodiment of a semiconductor die having a III-nitride semiconductor substrate and an charge protection layer.

FIG. 7 illustrates a partial cross-sectional view of a semiconductor device according to still another embodiment. The embodiment shown in FIG. 7 is similar to the embodiment shown in FIG. 1, however, the charge protection layer 124 is formed on the interlayer dielectric 128. According to this embodiment, the entire interlayer dielectric 128 is interposed between the charge protection layer 124 and the surface protection layer 116. This way, the gate 122 and the interlayer dielectric 128 are both interposed between the charge protection layer 124 and the surface protection layer 116. Also, the conductive vias 130, 132 to the source and drain contacts 118, 120 and to the gate 122 extend through both the charge protection layer 124 and the interlayer dielectric 128.

Figure 8:
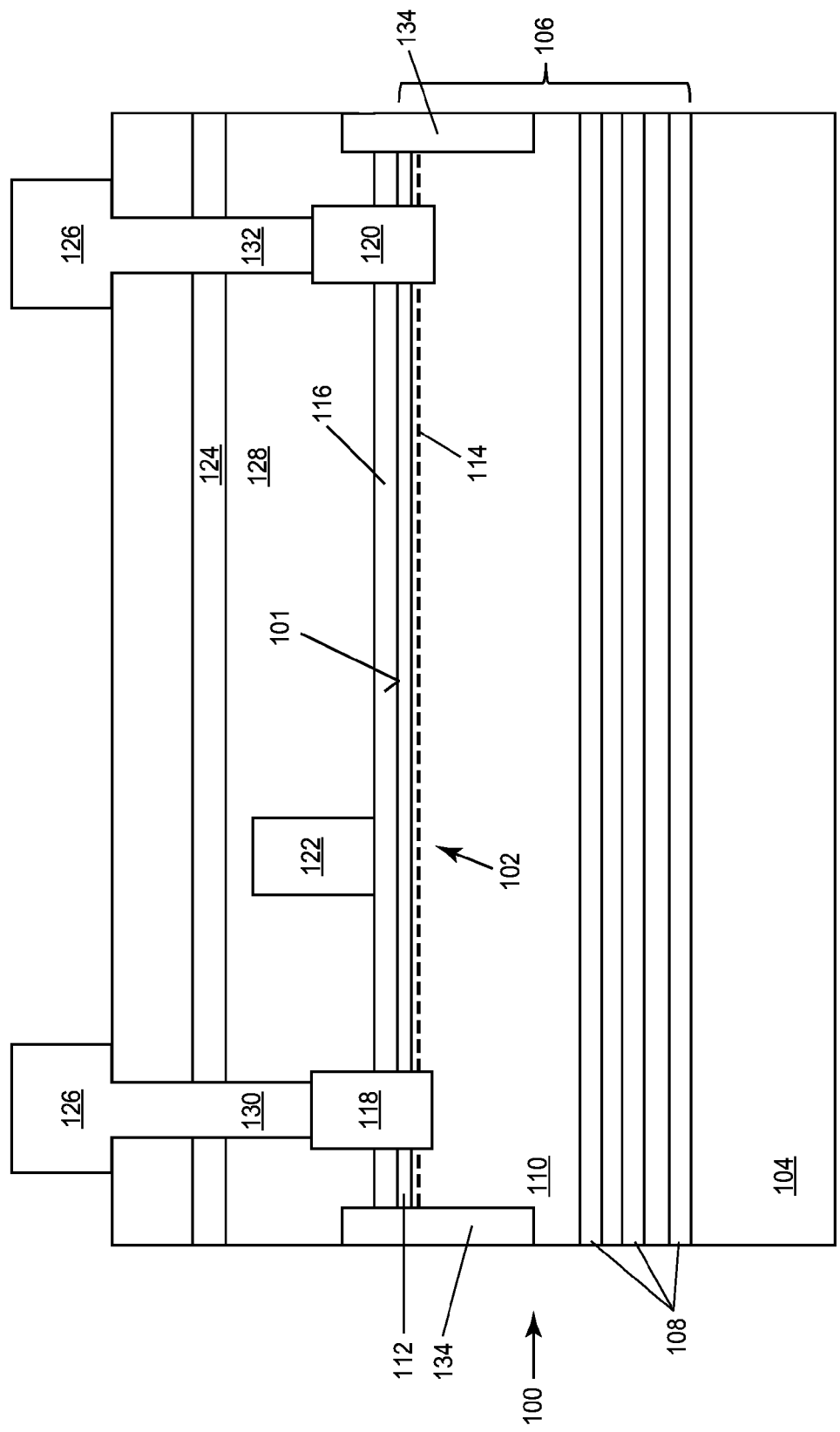
FIG. 8 illustrates a cross-sectional view of another embodiment of a semiconductor die having a III-nitride semiconductor substrate and an charge protection layer.

FIG. 8 illustrates a partial cross-sectional view of a semiconductor device according to another embodiment. The embodiment shown in FIG. 8 is similar to the embodiment shown in FIG. 7, however, the charge protection layer 124 is disposed in the interlayer dielectric 128. Only part of the interlayer dielectric 128 separates the charge protection layer 124 from the surface protection layer 116 according to this embodiment.

Figure 9:
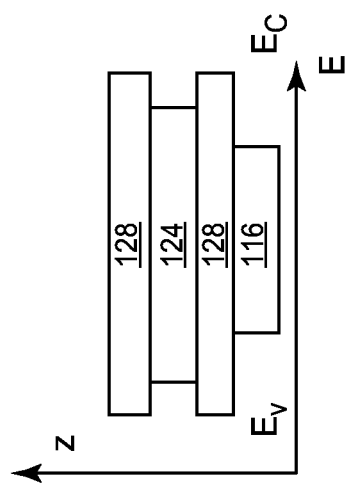
FIG. 9 illustrates a band gap diagram of the charge protection layer included in the device of FIG. 8, with the charge protection layer disposed in an interlayer dielectric.

FIG. 9 illustrates a corresponding band diagram for the charge protection layer 124 shown in FIG. 8. According to this embodiment, the surface protection layer 116 on which the charge protection layer 124 is formed comprises silicon nitride. The interlayer dielectric 128 comprises silicon dioxide ($SiO_2$) and the charge protection layer 124 comprises silicon oxynitride (SiON). The silicon oxynitride charge protection layer 124 disposed in the silicon dioxide interlayer dielectric 124 has a higher band gap energy than the upper and lower parts of the silicon dioxide 128.

Figure 10:
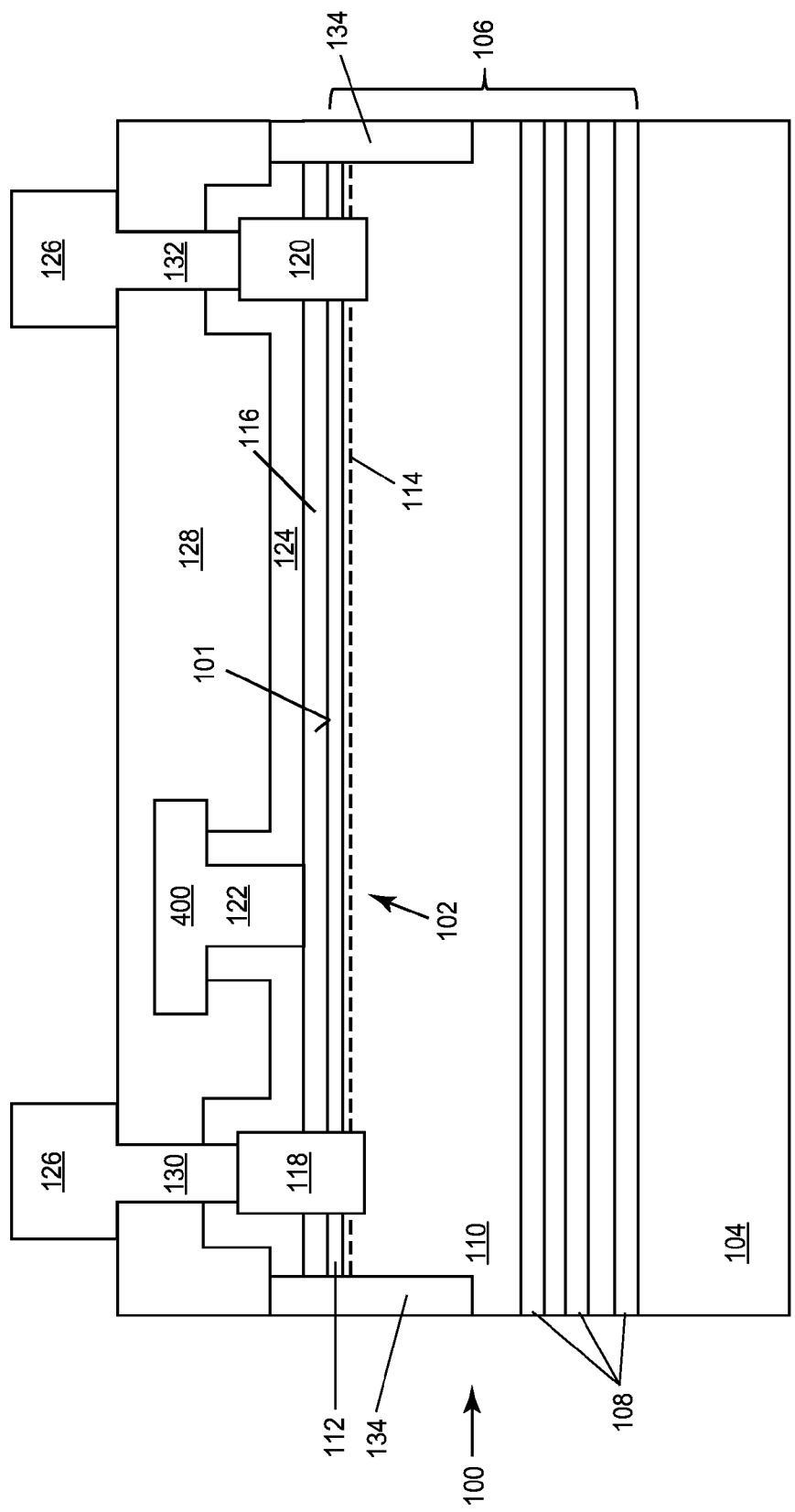
FIG. 10 illustrates a cross-sectional view of another embodiment of a semiconductor die having a III-nitride semiconductor substrate and an charge protection layer.

FIG. 10 illustrates a partial cross-sectional view of a semiconductor device according to an embodiment. The embodiment shown in FIG. 10 is similar to the embodiment shown in FIG. 6, however, the gate 122 has an extension 400 spaced apart from the surface protection layer 116 which extends in a direction parallel to the main surface 101 of the III-nitride semiconductor substrate 100. The extension 400 extends outward from the gate 122 in opposing directions according to this embodiment. The gate extension 400 provides additional charging protection.

Figure 11:
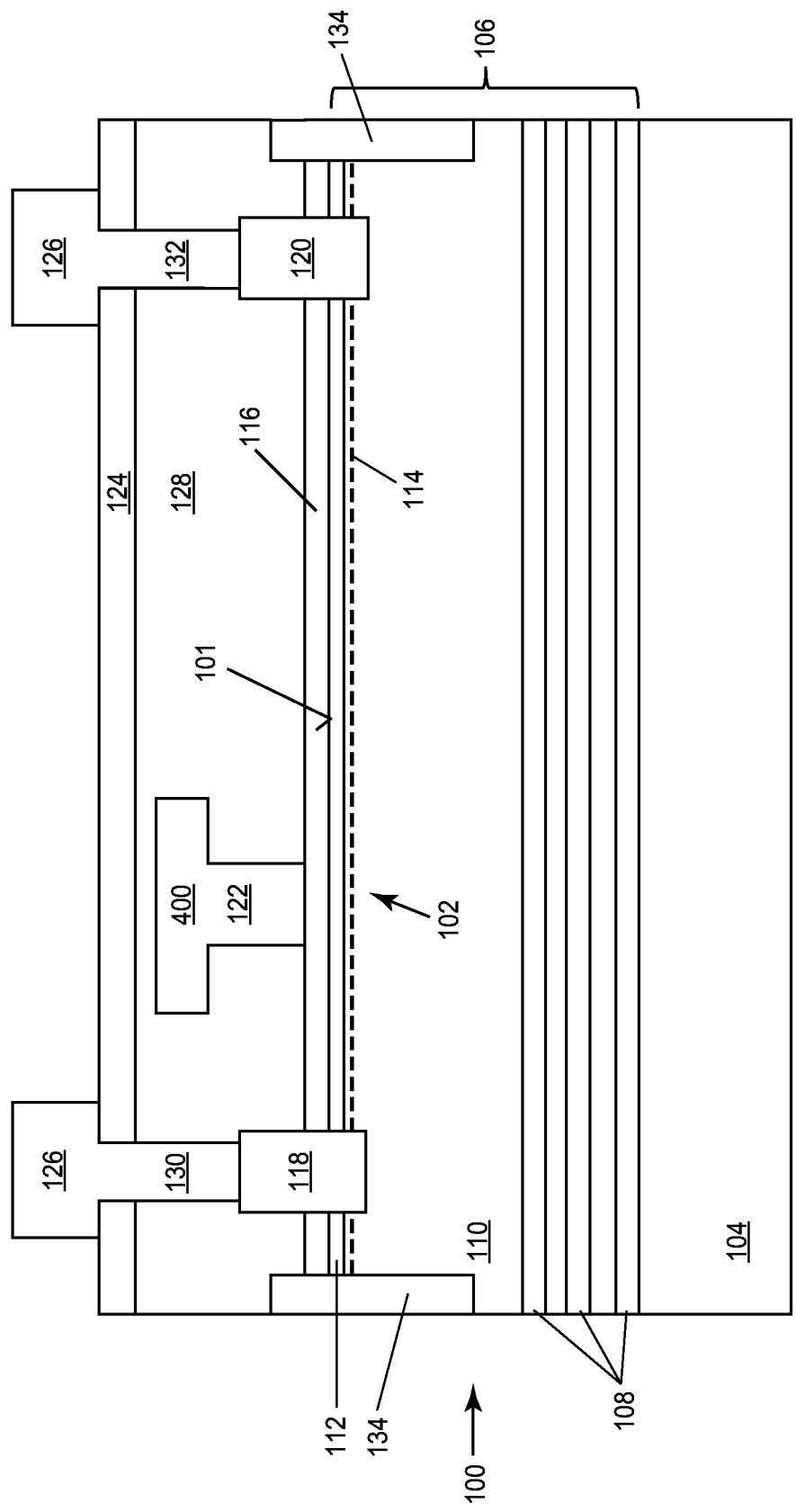
FIG. 11 illustrates a cross-sectional view of another embodiment of a semiconductor die having a III-nitride semiconductor substrate and an charge protection layer.

FIG. 11 illustrates a partial cross-sectional view of a semiconductor device according to another embodiment. The embodiment shown in FIG. 11 is similar to the embodiment shown in FIG. 10, however, the charge protection layer 124 is formed on the interlayer dielectric 128, e.g. as shown in FIG. 7.

Figure 12:
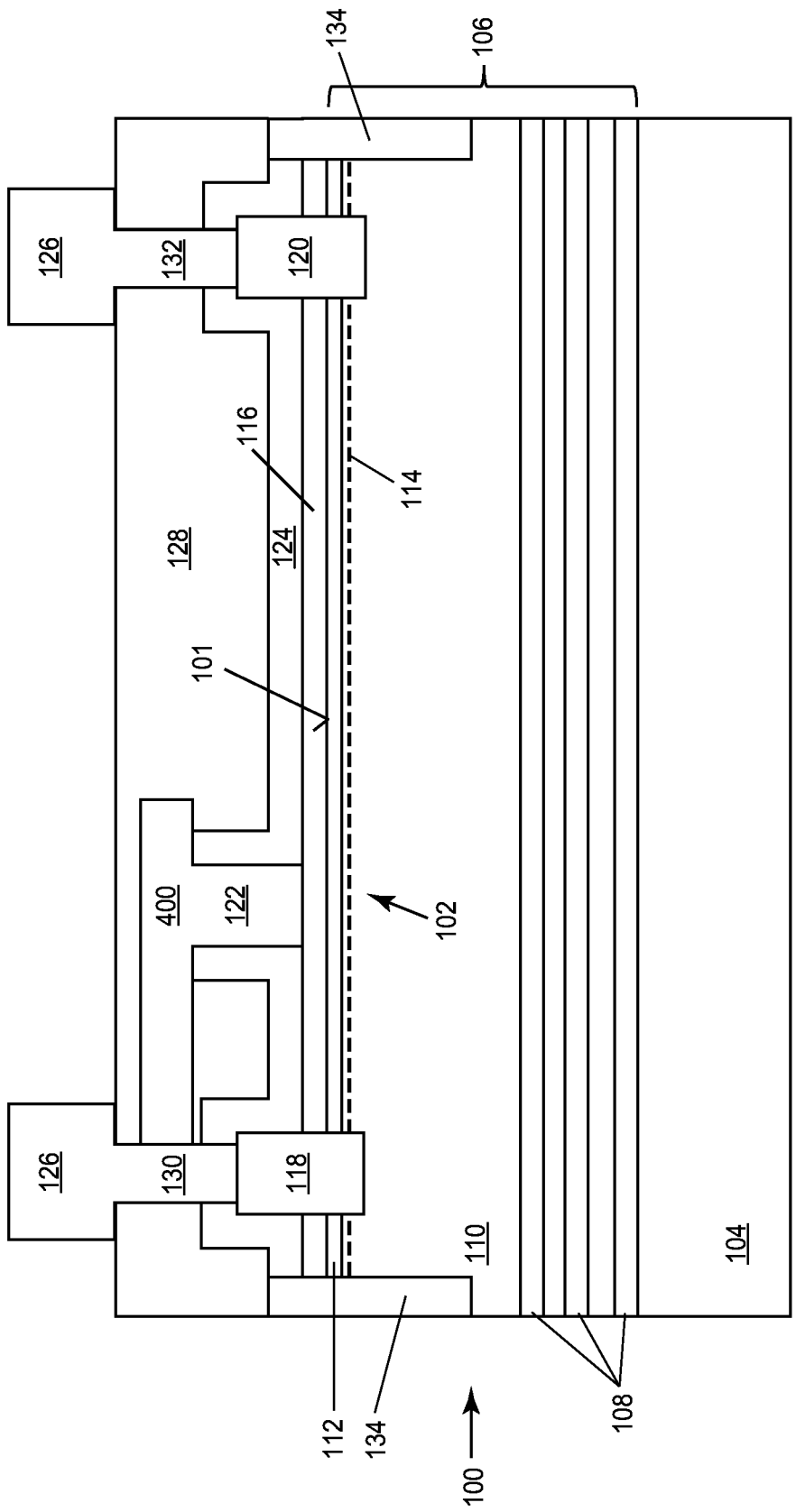
FIG. 12 illustrates a cross-sectional view of another embodiment of a semiconductor die having a III-nitride semiconductor substrate and an charge protection layer.

FIG. 12 illustrates a partial cross-sectional view of a semiconductor device according to yet another embodiment. The embodiment shown in FIG. 12 is similar to the embodiment shown in FIG. 10, however, the gate extension 400 is connected to the via 130 which electrically connects the source contact 118 to the overlying metallization 126. The semiconductor device is normally-on according to this embodiment because the gate 122 is at the same potential as the source 118.

Figure 13:
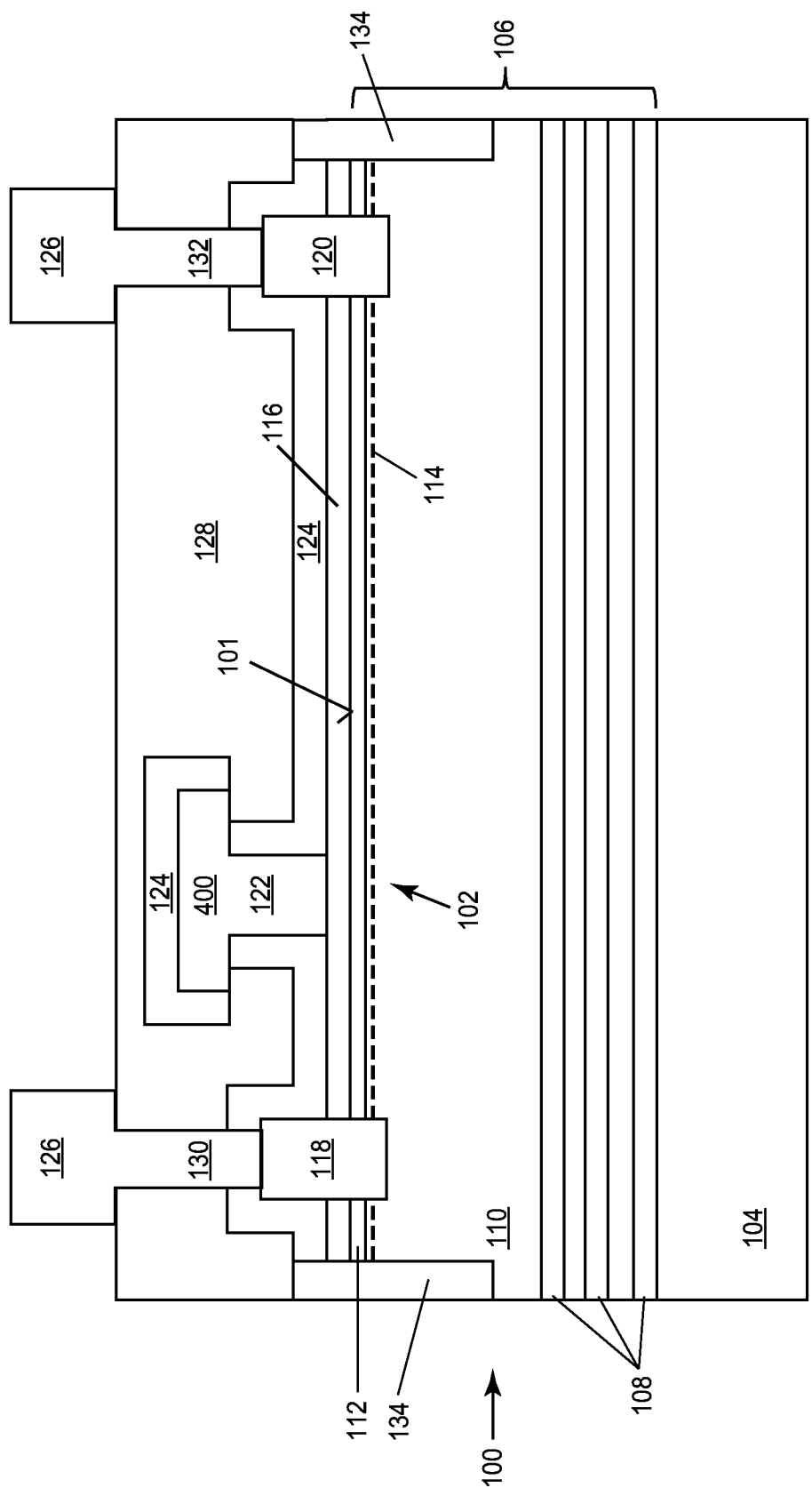
FIG. 13 illustrates a cross-sectional view of another embodiment of a semiconductor die having a III-nitride semiconductor substrate and an charge protection layer.

FIG. 13 illustrates a partial cross-sectional view of a semiconductor device according to still another embodiment. The embodiment shown in FIG. 13 is similar to the embodiment shown in FIG. 10, however, the charge protection layer 124 also covers the gate extension 400, to provide additional charging protection.

Figure 14:
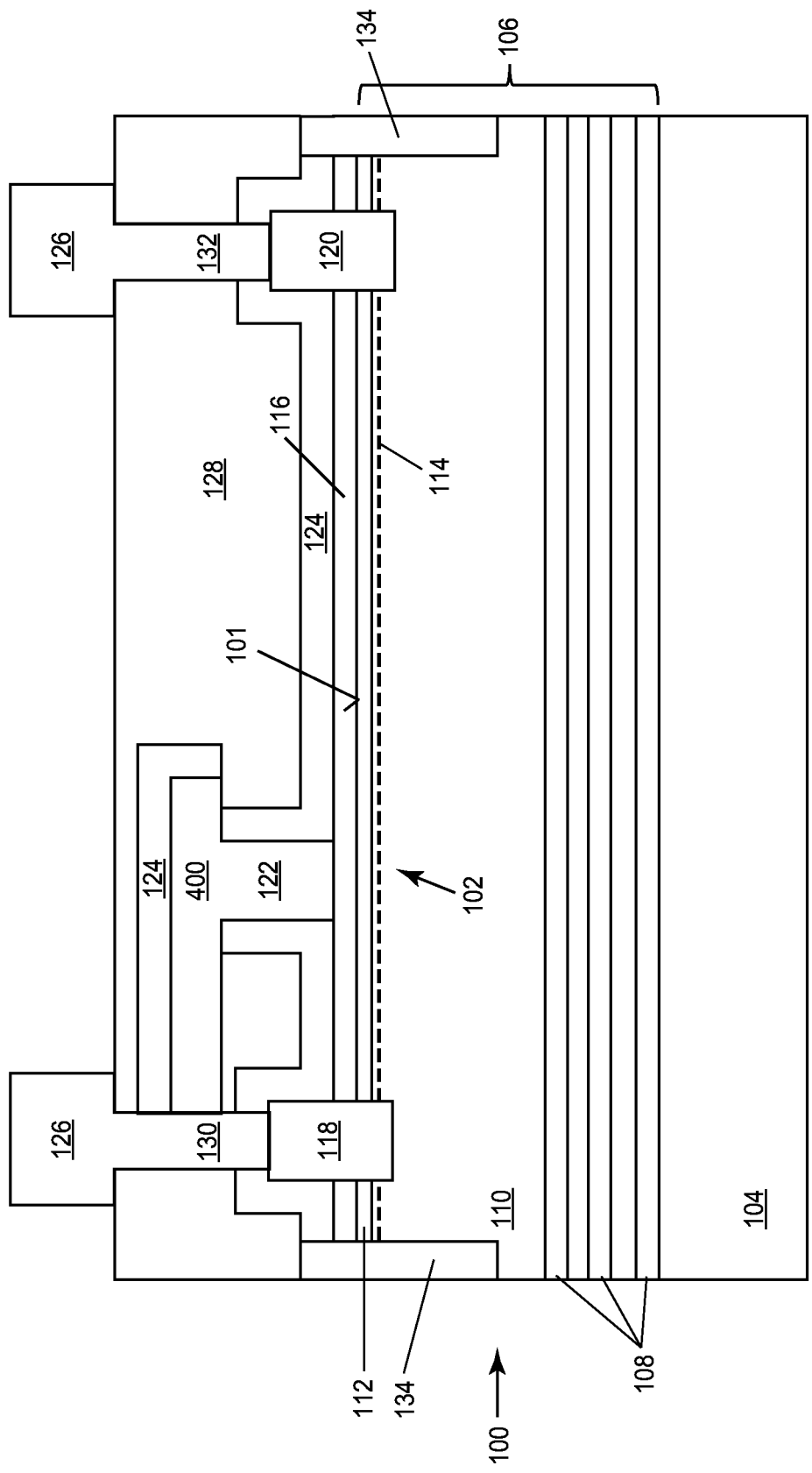
FIG. 14 illustrates a cross-sectional view of another embodiment of a semiconductor die having a III-nitride semiconductor substrate and an charge protection layer.

FIG. 14 illustrates a partial cross-sectional view of a semiconductor device according to an embodiment. The embodiment shown in FIG. 14 is similar to the embodiment shown in FIG. 12, however, the charge protection layer 124 also covers the gate extension 400 to provide additional charging protection.

Figure 15:
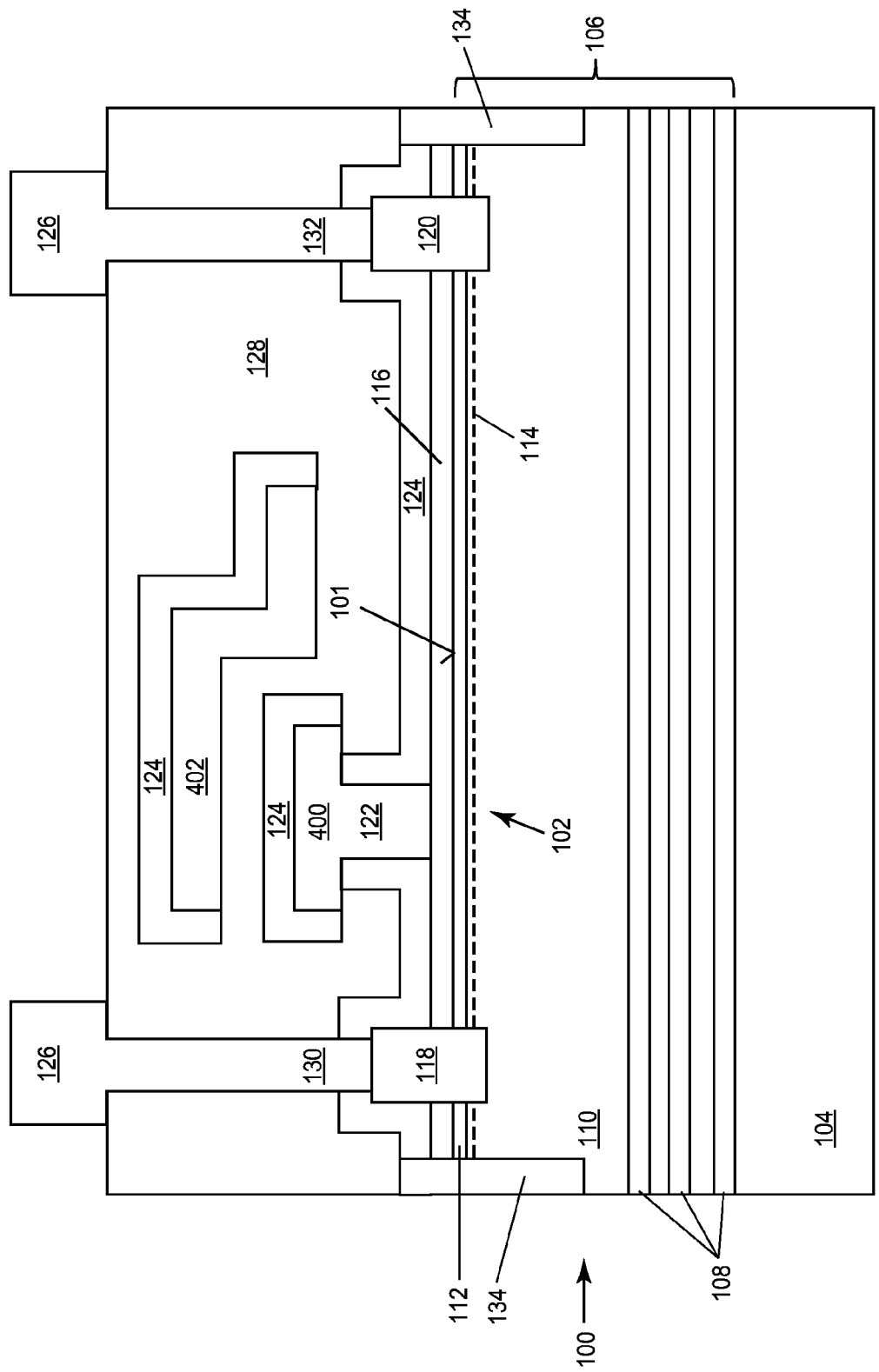
FIG. 15 illustrates a cross-sectional view of another embodiment of a semiconductor die having a III-nitride semiconductor substrate and an charge protection layer.

FIG. 15 illustrates a partial cross-sectional view of a semiconductor device according to an embodiment. The embodiment shown in FIG. 15 is similar to the embodiment shown in FIG. 13, however, a field plate 402 is disposed in the interlayer dielectric 128. The gate 122 and gate extension 400 are spaced apart from the field plate 402 in the interlayer dielectric 128. The charge protection layer 124 covers the gate 122, the gate extension 400 and the field plate 402 according to this embodiment to provide additional charging protection.

Figure 16:
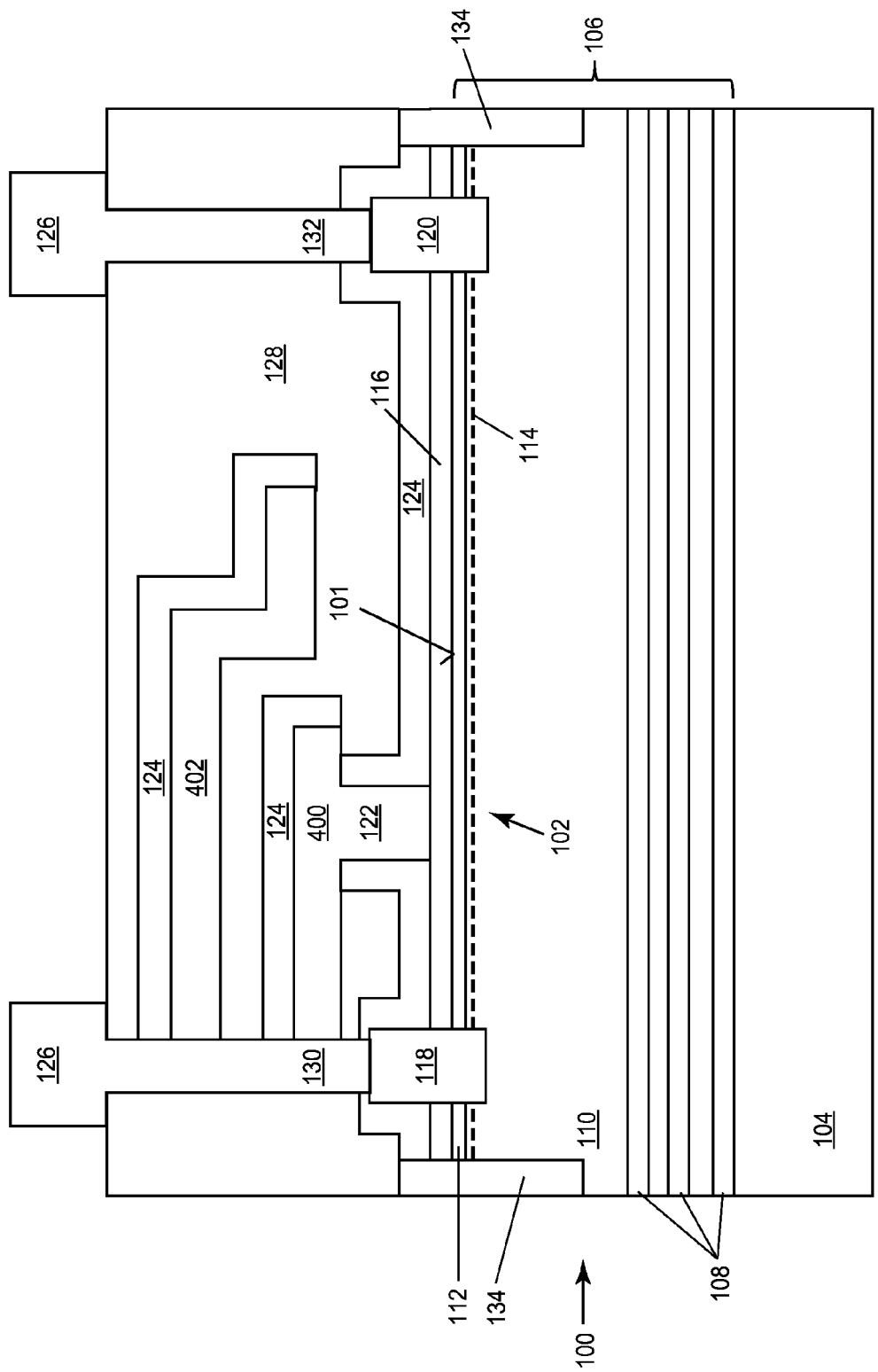
FIG. 16 illustrates a cross-sectional view of another embodiment of a semiconductor die having a III-nitride semiconductor substrate and an charge protection layer.

FIG. 16 illustrates a partial cross-sectional view of a semiconductor device according to an embodiment. The embodiment shown in FIG. 16 is similar to the embodiment shown in FIG. 15, however, the field plate 402 and the gate extension 400 are both connected to the via 130 which electrically connects the source contact 118 to the overlying metallization 126.

Figure 17:
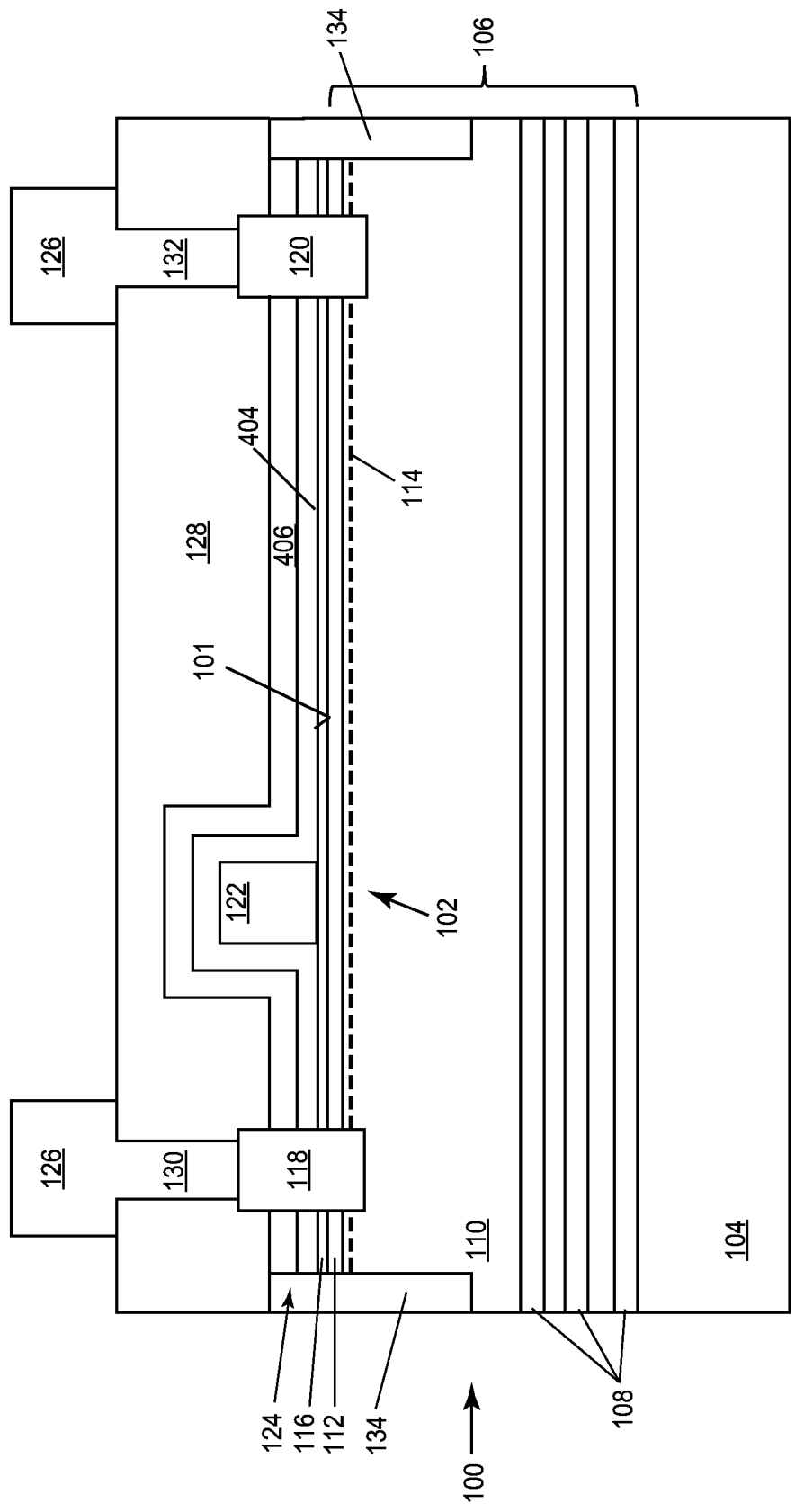
FIG. 17 illustrates a cross-sectional view of another embodiment of a semiconductor die having a III-nitride semiconductor substrate and an charge protection layer.

FIG. 17 illustrates a partial cross-sectional view of a semiconductor device according to another embodiment, and FIG.

Figure 18:
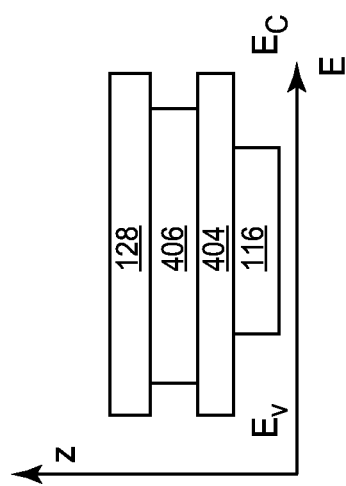
FIG. 18 illustrates a band gap diagram of the charge protection layer included in the device of FIG. 17, with sublayers of different oxygen concentrations.

18 illustrates a corresponding band diagram for the charge protection layer 124 shown in FIG. 17. The embodiment shown in FIG. 17 is similar to the embodiment shown in FIG. 1, however, the charge protection layer 124 comprises a first sub-layer 404 of silicon oxynitride on the surface protection layer 116 and a second sub-layer 406 of silicon oxynitride on the first sub-layer 404 so that the first sub-layer 404 is closer to the surface protection layer 116 than the second sub-layer 406. The first sub-layer 404 has a higher oxygen content than the second sub-layer 406, the surface protection layer 116 comprises silicon nitride, and the interlayer dielectric 128 comprises silicon dioxide or SiON with larger oxygen content than the first sub-layer 404 according to this embodiment, as illustrated in FIG. 18.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a III-nitride semiconductor substrate having a two-dimensional charge carrier gas at a depth from a main surface of the III-nitride semiconductor substrate;
a surface protection layer on the main surface of the III-nitride semiconductor substrate, the surface protection layer having charge traps in a band gap which exist at room temperature operation of the semiconductor device;
a contact in electrical connection with the two-dimensional charge carrier gas in the III-nitride semiconductor substrate; and
a charge protection layer on the surface protection layer, the charge protection layer comprising an oxide and shielding the surface protection layer under the charge protection layer from radiation with higher energy than the bandgap energy of silicon nitride,
wherein the charge protection layer has a stepwise or continuously-graded composition of oxygen and corresponding graded band gap energy,
wherein the composition of oxygen decreases in the charge protection layer heading toward the III-nitride semiconductor substrate in a direction perpendicular to the main surface of the III-nitride semiconductor substrate.

2. The semiconductor device according to claim 1, wherein the surface protection layer prevents oxidation of the main surface of the III-nitride semiconductor substrate.

3. The semiconductor device according to claim 1, wherein the charge protection layer covers the surface protection layer under the charge protection layer continuously or in segments.

4. The semiconductor device according to claim 1, wherein the contact extends through the surface protection layer to the two-dimensional charge carrier gas in the III-nitride semiconductor substrate.

5. The semiconductor device according to claim 1, wherein the charge protection layer comprises at least one of a metal oxide and silicon oxynitride.

6. The semiconductor device according to claim 5, wherein the metal oxide comprises at least one of a rare earth oxide, a rare earth oxynitride, $Al_2O_3$, $HfO_x$, $ZrO_x$, HfON and ZrON.

7. The semiconductor device according to claim 5, wherein the III-nitride semiconductor substrate comprises GaN and the surface protection layer comprises silicon nitride or GaN.

8. The semiconductor device according to claim 1, wherein the charge protection layer comprises a first sub-layer of silicon oxynitride on the surface protection layer and a second sub-layer of silicon oxynitride on the first sub-layer so that the first sub-layer is closer to the surface protection layer than the second sub-layer, and wherein the first sub-layer has a higher oxygen content than the second sub-layer.

9. The semiconductor device according to claim 8, further comprising silicon dioxide between the first sub-layer of silicon oxynitride and the surface protection layer.

10. The semiconductor device according to claim 1, further comprising a gate on the surface protection layer.

11. The semiconductor device according to claim 10, wherein the charge protection layer covers the gate on all sides of the gate except the side facing the surface protection layer.

12. The semiconductor device according to claim 10, wherein the gate extends through the charge protection layer.

13. The semiconductor device according to claim 12, wherein the charge protection layer covers sidewalls of the gate.

14. The semiconductor device according to claim 10, wherein the gate has an extension spaced apart from the surface protection layer and which extends in a direction parallel to the main surface of the III-nitride semiconductor substrate.

15. The semiconductor device according to claim 14, wherein the charge protection layer covers the gate extension.

16. The semiconductor device according to claim 10, wherein the gate is disposed in an interlayer dielectric and the charge protection layer is disposed above the gate so that the gate and the interlayer dielectric are both interposed between the charge protection layer and the surface protection layer.

17. The semiconductor device according to claim 10, further comprising a field plate disposed in an interlayer dielectric on the surface protection layer, wherein the gate is spaced apart from the field plate spaced in the interlayer dielectric and the charge protection layer covers the gate and the field plate.

18. The semiconductor device according to claim 1, further comprising an interlayer dielectric on the surface protection layer, wherein at least part of the interlayer dielectric is interposed between the charge protection layer and the surface protection layer.

19. The semiconductor device according to claim 18, wherein the charge protection layer is disposed in the interlayer dielectric and only part of the interlayer dielectric separates the charge protection layer from the surface protection layer.

20. A method of manufacturing a semiconductor device, the method comprising:
forming a III-nitride semiconductor substrate having a two-dimensional charge carrier gas at a depth from a main surface of the III-nitride semiconductor substrate;
forming a surface protection layer on the main surface of the III-nitride semiconductor substrate, the surface protection layer having charge traps in a band gap which exist at room temperature operation of the semiconductor device;
forming a contact in electrical connection with the two-dimensional charge carrier gas in the III-nitride semiconductor substrate;
forming a charge protection layer on the surface protection layer, the charge protection layer comprising an oxide and shielding the surface protection layer under the charge protection layer from radiation with higher energy than the bandgap energy of silicon nitride; and
stepwise or continuously grading the composition of oxygen in the charge protection layer so that the charge protection layer has a corresponding graded band gap energy, by decreasing the composition of oxygen in the charge protection layer heading toward the III-nitride semiconductor substrate in a direction perpendicular to the main surface of the III-nitride semiconductor substrate.

21. The method according to claim 20, wherein forming the charge protection layer comprises:
forming a first sub-layer of silicon oxynitride on the surface protection layer; and
forming a second sub-layer of silicon oxynitride on the first sub-layer so that the first sub-layer is closer to the surface protection layer than the second sub-layer, the second sub-layer having a lower oxygen content than the first sub-layer.

22. The method according to claim 21, further comprising forming silicon dioxide between the first sub-layer of silicon oxynitride and the surface protection layer.

23. The method according to claim 20, further comprising forming an interlayer dielectric on the surface protection layer.

24. The method according to claim 23, wherein the charge protection layer is formed in the interlayer dielectric so that only part of the interlayer dielectric separates the charge protection layer from the surface protection layer.

25. The method according to claim 20, wherein at least one electrical contact is formed after the charge protection layer and extends through the charge protection layer and the surface protection layer to the two-dimensional charge carrier gas in the III-nitride semiconductor substrate.

26. A semiconductor device, comprising:
a III-nitride semiconductor substrate having a two-dimensional charge carrier gas at a depth from a main surface of the III-nitride semiconductor substrate;
a surface protection layer on the main surface of the III-nitride semiconductor substrate, the surface protection layer having charge traps in a band gap which exist at room temperature operation of the semiconductor device;
a contact in electrical connection with the two-dimensional charge carrier gas in the III-nitride semiconductor substrate; and
a charge protection layer on the surface protection layer, the charge protection layer comprising an oxide and shielding the surface protection layer under the charge protection layer from radiation with higher energy than the bandgap energy of silicon nitride,
wherein the charge protection layer comprises a first sub-layer of silicon oxynitride on the surface protection layer and a second sub-layer of silicon oxynitride on the first sub-layer so that the first sub-layer is closer to the surface protection layer than the second sub-layer, the first sub-layer having a higher oxygen content than the second sub-layer.

27. A semiconductor device, comprising:
a III-nitride semiconductor substrate having a two-dimensional charge carrier gas at a depth from a main surface of the III-nitride semiconductor substrate;
a surface protection layer on the main surface of the III-nitride semiconductor substrate, the surface protection layer having charge traps in a band gap which exist at room temperature operation of the semiconductor device;
a contact in electrical connection with the two-dimensional charge carrier gas in the III-nitride semiconductor substrate;
a charge protection layer on the surface protection layer, the charge protection layer comprising an oxide and shielding the surface protection layer under the charge protection layer from radiation with higher energy than the bandgap energy of silicon nitride; and
an interlayer dielectric on the surface protection layer, at least part of the interlayer dielectric being interposed between the charge protection layer and the surface protection layer,
wherein the charge protection layer is disposed in the interlayer dielectric and only part of the interlayer dielectric separates the charge protection layer from the surface protection layer.

28. A method of manufacturing a semiconductor device, the method comprising:
forming a III-nitride semiconductor substrate having a two-dimensional charge carrier gas at a depth from a main surface of the III-nitride semiconductor substrate;
forming a surface protection layer on the main surface of the III-nitride semiconductor substrate, the surface protection layer having charge traps in a band gap which exist at room temperature operation of the semiconductor device;
forming a contact in electrical connection with the two-dimensional charge carrier gas in the III-nitride semiconductor substrate; and
forming a charge protection layer on the surface protection layer, the charge protection layer comprising an oxide and shielding the surface protection layer under the charge protection layer from radiation with higher energy than the bandgap energy of silicon nitride,
wherein forming the charge protection layer comprises:
forming a first sub-layer of silicon oxynitride on the surface protection layer; and
forming a second sub-layer of silicon oxynitride on the first sub-layer so that the first sub-layer is closer to the surface protection layer than the second sub-layer, the second sub-layer having a lower oxygen content than the first sub-layer.

29. A method of manufacturing a semiconductor device, the method comprising:
forming a III-nitride semiconductor substrate having a two-dimensional charge carrier gas at a depth from a main surface of the III-nitride semiconductor substrate;
forming a surface protection layer on the main surface of the III-nitride semiconductor substrate, the surface protection layer having charge traps in a band gap which exist at room temperature operation of the semiconductor device;

forming a contact in electrical connection with the two-dimensional charge carrier gas in the III-nitride semiconductor substrate;

forming a charge protection layer on the surface protection layer, the charge protection layer comprising an oxide and shielding the surface protection layer under the charge protection layer from radiation with higher energy than the bandgap energy of silicon nitride; and forming an interlayer dielectric on the surface protection layer, wherein the charge protection layer is formed in the interlayer dielectric so that only part of the interlayer dielectric separates the charge protection layer from the surface protection layer.

* * * * *